US008321157B2

(12) United States Patent
Omori et al.

(10) Patent No.: US 8,321,157 B2
(45) Date of Patent: Nov. 27, 2012

(54) MONITORING DEVICE AND MONITORING METHOD

(75) Inventors: Takahiro Omori, Kawasaki (JP); Kenji Hirohata, Tokyo (JP); Minoru Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 12/729,306

(22) Filed: Mar. 23, 2010

(65) Prior Publication Data
US 2010/0250149 A1 Sep. 30, 2010

(30) Foreign Application Priority Data

Mar. 25, 2009 (JP) ................................. 2009-073411

(51) Int. Cl.
G01B 7/16 (2006.01)
G01B 21/32 (2006.01)
(52) U.S. Cl. ....... 702/34; 702/136; 702/41; 324/750.03; 324/537
(58) Field of Classification Search .................... 702/34, 702/136, 41
See application file for complete search history.

(56) References Cited

U.S. PATENT DOCUMENTS

| 3,911,725 | A  | * | 10/1975 | Selivanov et al. | 374/46 |
| 4,821,577 | A  | * | 4/1989  | Thiercelin et al. | 73/799 |
| 5,867,809 | A  | * | 2/1999  | Soga et al. | 702/130 |
| 6,532,421 | B2 | * | 3/2003  | Miwa | 702/34 |
| 6,678,627 | B1 | * | 1/2004  | Starr | 702/119 |
| 7,050,912 | B2 | * | 5/2006  | Bernhardi et al. | 702/42 |
| 7,069,158 | B2 | * | 6/2006  | Gidwani | 702/56 |
| 7,098,683 | B2 | * | 8/2006  | Matsubara et al. | 318/490 |
| 7,171,314 | B2 | * | 1/2007  | Meyer et al. | 702/42 |
| 7,514,941 | B2 | * | 4/2009  | Barton | 324/719 |
| 2007/0100565 | A1 | * | 5/2007 | Gosse et al. | 702/34 |
| 2008/0015827 | A1 | * | 1/2008 | Tryon et al. | 703/2 |
| 2010/0070204 | A1 |   | 3/2010 | Monda et al. | |
| 2010/0175378 | A1 | * | 7/2010 | Tyler et al. | 60/660 |

FOREIGN PATENT DOCUMENTS

JP 07-306239 11/1995

OTHER PUBLICATIONS

Qiang Yu et al., "Fatigue Assessment of Lead-Free Solder Joints", Tima Editions / Therminic 2005, p. 204-211.*
Qiang Yu et al., "Fatigue-Strength Prediction of Microelectronics Solder Joints Under Thermal Cycling Loading", IEEE Transactions on Components, Packaging, and Manufacturing Technology—Part A, vol. 20, No. 3, Sep. 1997, p. 266-273.*

* cited by examiner

Primary Examiner — Mohamed Charioui
Assistant Examiner — Alexander Satanovsky
(74) Attorney, Agent, or Firm — Turocy & Watson, LLP

(57) ABSTRACT

A dummy junction which will break earlier than a target junction is arranged on a board. A history of load applied to the dummy junction until the dummy junction actually breaks is recorded, and an estimated lifetime of the target junction is calibrated when a lifetime of the dummy junction estimated by the history of the load is largely different from an actual lifetime of the dummy junction. The calibration is performed by subtracting a value of an unmeasurable load from the estimated lifetime of the target junction based on load ever applied to the target junction, and the unmeasurable load is calculated based on the difference of the actual lifetime and estimated lifetime of the dummy junction.

12 Claims, 20 Drawing Sheets

ΔR: VARIATION OF CURVATURE RADIUS NEAR TARGET JUNCTION/DUMMY JUNCTION
Δz: DISPLACEMENT IN OUTER DIRECTION OF BOARD SURFACE NEAR TARGET JUNCTION/DUMMY JUNCTION $D_{v1}$ : DAMAGE VALUE OF DUMMY JUNCTION INDUCED BY VIBRATION
$D_{v2}$ : DAMAGE VALUE OF TARGET JUNCTION INDUCED BY VIBRATION
$N_{f,v1}$: REPETITION CYCLE NUMBER OF VIBRATION UNITL BREAK OCCURS DUE TO STRAIN AMPLITUDE $\Delta\varepsilon_1$
$N_{f,v2}$: REPETITION CYCLE NUMBER OF VIBRATION UNTIL BREAK OCCURS DUE TO STRAIN AMPLITUDE $\Delta\varepsilon_2$
$N$ : REPETITION CYCLE NUMBER OF $\Delta\varepsilon_1$ UNTIL $D_{v1}$ IS OBTAINED, WIHT ASSUMPTION THAT SAME REPETITION CYCLE NUMBER IS APPLIED TO $\Delta\varepsilon_2$ $$D_{v1} = N/N_{f,v1} = N/\alpha\Delta\varepsilon_1^{-\beta}$$

$$(\Delta\varepsilon_1/\Delta\varepsilon_2 = \Delta k)$$

$$D_{v2} = N/N_{f,v2} = N/\alpha\Delta\varepsilon_2^{-\beta} = N/\alpha(\Delta\varepsilon_1/\Delta k)^{-\beta}$$

$$\therefore D_{v2} = N/\alpha\Delta\varepsilon_1^{-\beta}\Delta k^{-\beta} = D_{v1} \cdot \Delta k^{-\beta}$$

FIG. 18

MONITORING DEVICE AND MONITORING METHOD

CROSS REFERENCE TO RELATED APPLICATIONS

This application is based upon and claims the benefit of priority from the prior Japanese Patent Application No. 2009-73411, filed on Mar. 25, 2009, the entire contents of which are incorporated herein by reference.

FIELD OF THE INVENTION

The present invention relates to a monitoring device and a monitoring method for monitoring the state of an electronic device.

RELATED ART

Components arranged in a mobile electronic device such as a cellular phone and a notebook PC occasionally fails or get out of order due to an external force when the mobile electronic device is used or carried. The mobile electronic device fails not only due to the external force applied to the device only one time but also due to an accumulated damage generated by loads repeatedly applied to the device.

For example, temperature variation generated by turning a power source ON or OFF generates repeated stress in junctions (solder junctions, for example) since a board and a component mounted thereon in a housing have linear expansion coefficients different from each other. Further, when the device is placed in a state where vibration is constantly applied thereto, the repeated stress is generated since inertial force acts all the time.

The component may not fail when a load (stress) is applied only one time but may fail when the load is repeatedly applied in the long term.

There is a health monitoring technique to predict the lifetime of a product to be used for the long terms by checking the state of the product. There are various kinds of health monitoring techniques. As one example, the lifetime of the above electronic device can be predicted based on a load repeatedly applied to the device.

A recent electronic device has sensors such as a temperature sensor and an acceleration sensor, each of which takes various actions by monitoring the state of the device in operation.

For example, a failure due to the rise of temperature can be prevented by sensing the temperature of an arithmetic processing component such as a CPU all the time to forcibly reduce the arithmetic load when the temperature rises and exceeds a threshold value. Further, when the acceleration sensor is used to detect the acceleration and inclination of the device, it is possible to retract the head of a hard disk drive or to start an application specified by a user.

These sensors are expected to predict the lifetime induced by fatigue such as the above repeated stress.

As an example of such a technique, JP-A 7(1995)-306239 (Kokai) describes a technique to estimate the residual lifetime of a component by the value recorded by sensors arranged in an electronic product to detect and record temperature etc. According to JP-A 7(1995)-306239 (Kokai), when scrapping the electronic product, whether or not the product can be recycled can be judged by the recorded information.

In principle, if every load supposed to influence the lifetime can be sensed and recorded, the lifetime can be predicted with higher accuracy compared to the case where only a few kinds of loads are sensed.

However, actually, it is difficult to sense every load for various reasons. For example, a mobile electronic device such as a notebook-sized personal computer is not always supplied with power. In this case, when the power is not supplied, the load cannot be sensed and recorded. There is a strong possibility that a load such as collision and pressure acts when the mobile electronic device is carried with the power source turned off.

SUMMARY OF THE INVENTION

According to an aspect of the present invention, there is provided with a monitoring device for an electronic device which includes a board and at least one electronic component mounted thereon, the board and the electronic component being coupled each other through a target junction and a dummy junction at difference positions, comprising:

a temperature sensor configured to detect a temperature in the electronic device;

a temperature information database configured to store variation history of the temperature;

a sensor temperature/strain database configured to store a strain value generated in the target junction and a strain value generated in the dummy junction with respect to each of a plurality temperatures;

a fatigue characteristic database configured to store a dummy damage function representing a relation among a strain amplitude representing magnitude of variation of the strain value, a cycle number of the strain amplitude and a temperature damage value of the dummy junction indicating an accumulated fatigue on the dummy junction due to temperature variation, and a target damage function representing a relation among a strain amplitude, a cycle number of the strain amplitude and a temperature damage value of the target junction indicating an accumulated fatigue on the target junction due to temperature variation;

a complex load database configured to store:

(a) dummy lifetime data which defines a relation between the temperature damage value of the dummy junction and a load damage value indicating an accumulated fatigue on the dummy junction due to a first load which is different from the temperature variation;

(b) target lifetime data which defines a relation between the temperature damage value of the target junction and a load damage value indicating an accumulated fatigue on the target junction due to the first load; and (c) load correspondence data which defines a relation between the load damage value of the dummy junction and the load damage value of the target junction;

an electrical characteristic measurer configured to measure an electrical characteristic of the dummy junction; and a lifetime computing unit configured to:

(A-1) calculate the temperature damage value of the target junction by using the target damage function based on the variation history;

(A-2) estimate a lifetime of the target junction based on comparison between the temperature damage value of the target junction and a first threshold value being a temperature damage value corresponding to 0 of the load damage value of the target junction in the target lifetime data;

(B-1) calculate the temperature damage value of the dummy junction by using the dummy damage function based on the temperature history data when a break of the dummy junction is detected based on the electrical characteristic measured by the electrical characteristic measurer;

(B-2) compare the temperature damage value of the dummy junction with a second threshold value being a temperature damage value corresponding to 0 of the load damage value of the dummy junction in the dummy lifetime data;

(B-3) calculate the load damage value of the dummy junction based on the dummy lifetime data according to the temperature damage value of the dummy junction when a difference between the second threshold value and the temperature damage value of the dummy junction is equal to or greater than a predetermined value;

(B-4) calculate the load damage value of the target junction based on the load damage value of the dummy junction by using the load correspondence function; and (B-5) change the first threshold value to a temperature damage value corresponding to the load damage value of the target junction in the target lifetime data.

According to an aspect of the present invention, there is provided with a monitoring method for an electronic device which includes a board and at least one electronic component mounted thereon, the board and the electronic component being coupled each other through a target junction and a dummy junction at difference positions, comprising:

reading in a temperature information database configured to store variation history of the temperature;

reading in a sensor temperature/strain database configured to store a strain value generated in the target junction and a strain value generated in the dummy junction with respect to each of a plurality temperatures;

reading in a fatigue characteristic database configured to store a dummy damage function representing a relation among a strain amplitude representing magnitude of variation of the strain value, a cycle number of the strain amplitude and a temperature damage value of the dummy junction indicating an accumulated fatigue on the dummy junction due to temperature variation, and a target damage function representing a relation among a strain amplitude, a cycle number of the strain amplitude and a temperature damage value of the target junction indicating an accumulated fatigue on the target junction due to temperature variation;

reading in a complex load database configured to store:

(a) dummy lifetime data which defines a relation between the temperature damage value of the dummy junction and a load damage value indicating an accumulated fatigue on the dummy junction due to a first load which is different from the temperature variation;

(b) target lifetime data which defines a relation between the temperature damage value of the target junction and a load damage value indicating an accumulated fatigue on the target junction due to the first load; and (c) load correspondence data which defines a relation between the load damage value of the dummy junction and the load damage value of the target junction;

measuring an electrical characteristic of the dummy junction; and (A-1) calculating the temperature damage value of the target junction by using the target damage function based on the variation history;

(A-2) estimating a lifetime of the target junction based on comparison between the temperature damage value of the target junction and a first threshold value which is a temperature damage value corresponding to 0 of the load damage value of the target junction in the target lifetime data;

(B-1) calculating the temperature damage value of the dummy junction by using the dummy damage function based on the variation history when a break of the dummy junction is detected based on the electrical characteristic of the dummy junction;

(B-2) comparing the temperature damage value of the dummy junction with a second threshold value being a temperature damage value corresponding to 0 of the load damage value of the dummy junction in the dummy lifetime data;

(B-3) calculating the load damage value of the dummy junction based on the dummy lifetime data according to the temperature damage value of the dummy junction when a difference between the second threshold value and the temperature damage value of the dummy junction is equal to or greater than a predetermined value;

(B-4) calculating the load damage value of the target junction based on the load damage value of the dummy junction by using the load correspondence function; and (B-5) changing the first threshold value to a temperature damage value corresponding to the load damage value of the target junction in the target lifetime data.

BRIEF DESCRIPTION OF THE DRAWINGS

FIG. 18 is a diagram showing an example of load correspondence data.

DETAILED DESCRIPTION OF THE INVENTION

First Embodiment

Figure 1:
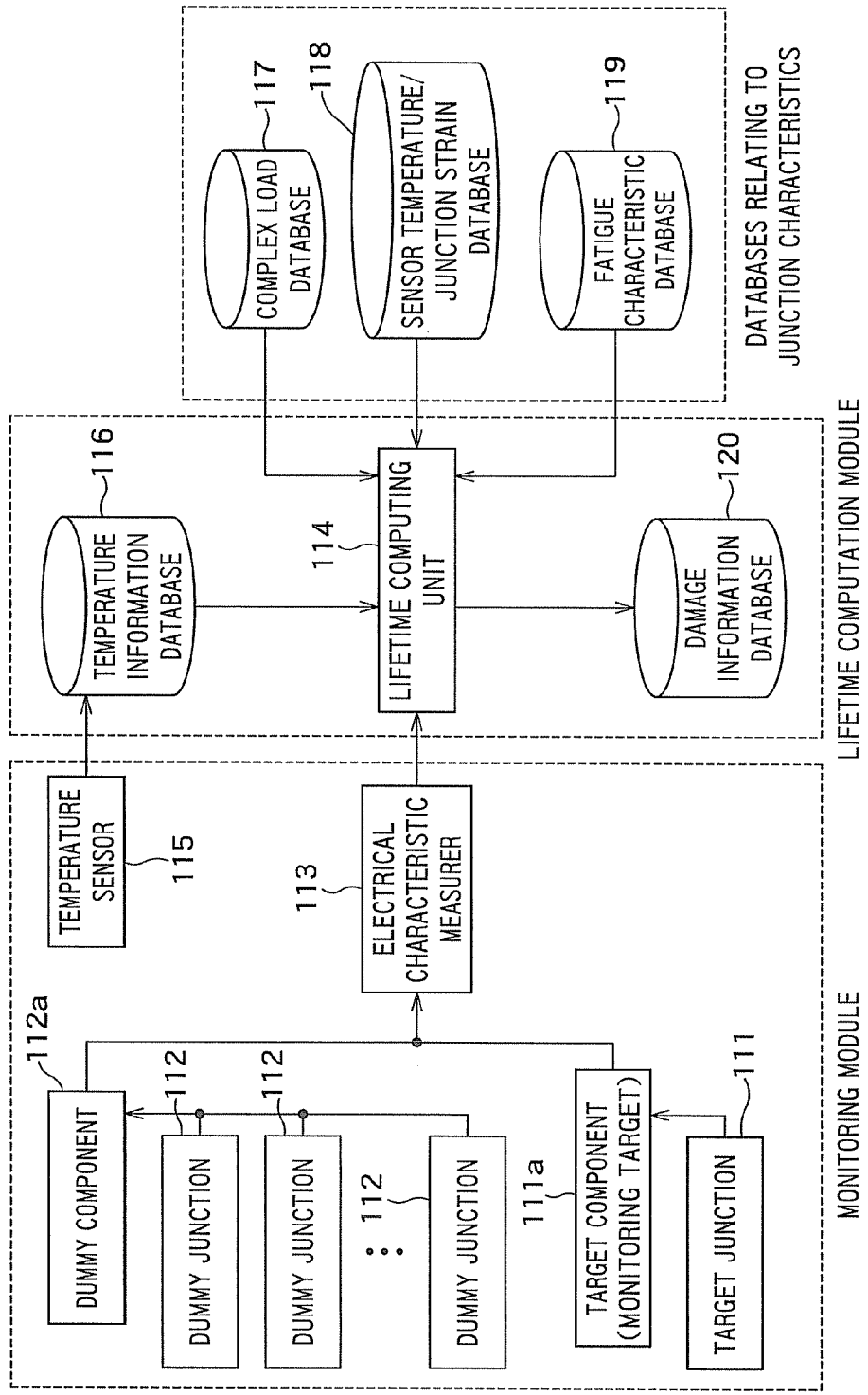
FIG. 1 is a block diagram showing the schematic structure of a monitoring system having a monitoring device according to a first embodiment of the present invention.

FIG. 1 is a block diagram showing the schematic structure of a monitoring system having a monitoring device according to a first embodiment of the present invention.

The monitoring system includes a board having a target component 111a and a dummy component 112a mounted thereon. This board is arranged in an electronic device such as a PC. The target component 111a is connected to the board through a target junction 111, while the dummy component 112a is connected to the board through one or a plurality of dummy junctions 112. The dummy junction 112 is placed in a position where the dummy junction 112 is broken earlier than the target junction 111 with a strong possibility due to a temperature variation and a load (first load) different from the temperature variation. That is, the dummy junction 112 is arranged in a positions where the lifetime of the dummy junction 112 becomes shorter than the target junction 111 due to a temperature variation and other kind of load (first load). In the present embodiment, each of the target junction 111 and the dummy junction 112 is a solder bump (solder junction.) The dummy component 112a and the target component 111a may be the same component or different components. Although the first load is assumed to be vibration, shock, etc. applied from the outside, the first load assumed in this case is vibration.

In addition to the target component 111a, the target junction 111, the dummy component 112a, and the dummy junction 112, the monitoring system of FIG. 1 further includes: an electrical characteristic measurer 113; a temperature sensor 115; a lifetime computing unit 114; a temperature information database 116; a complex load database 117; a sensor temperature/junction strain database 118; a fatigue characteristic database 119; and a damage information database 120. The elements 113 to 120 form the monitoring device according to the first embodiment of the present invention. The lifetime computing unit 114 includes a reading unit for reading data from each of the databases 116 to 120.

Note that the lifetime computing unit 114 and the electrical characteristic measurer 113 may be formed of hardware or program modules. When these elements are formed of program modules, each program module is stored in a recording medium such as a nonvolatile memory and a hard disk to be read by a computer such as a CPU, and is executed directly or by being developed in a memory device such as a RAM. Each of the databases 116 to 120 can be formed of a recording medium such as a memory device, a hard disk, a CD-ROM, and a USB memory, for example.

Figure 2:
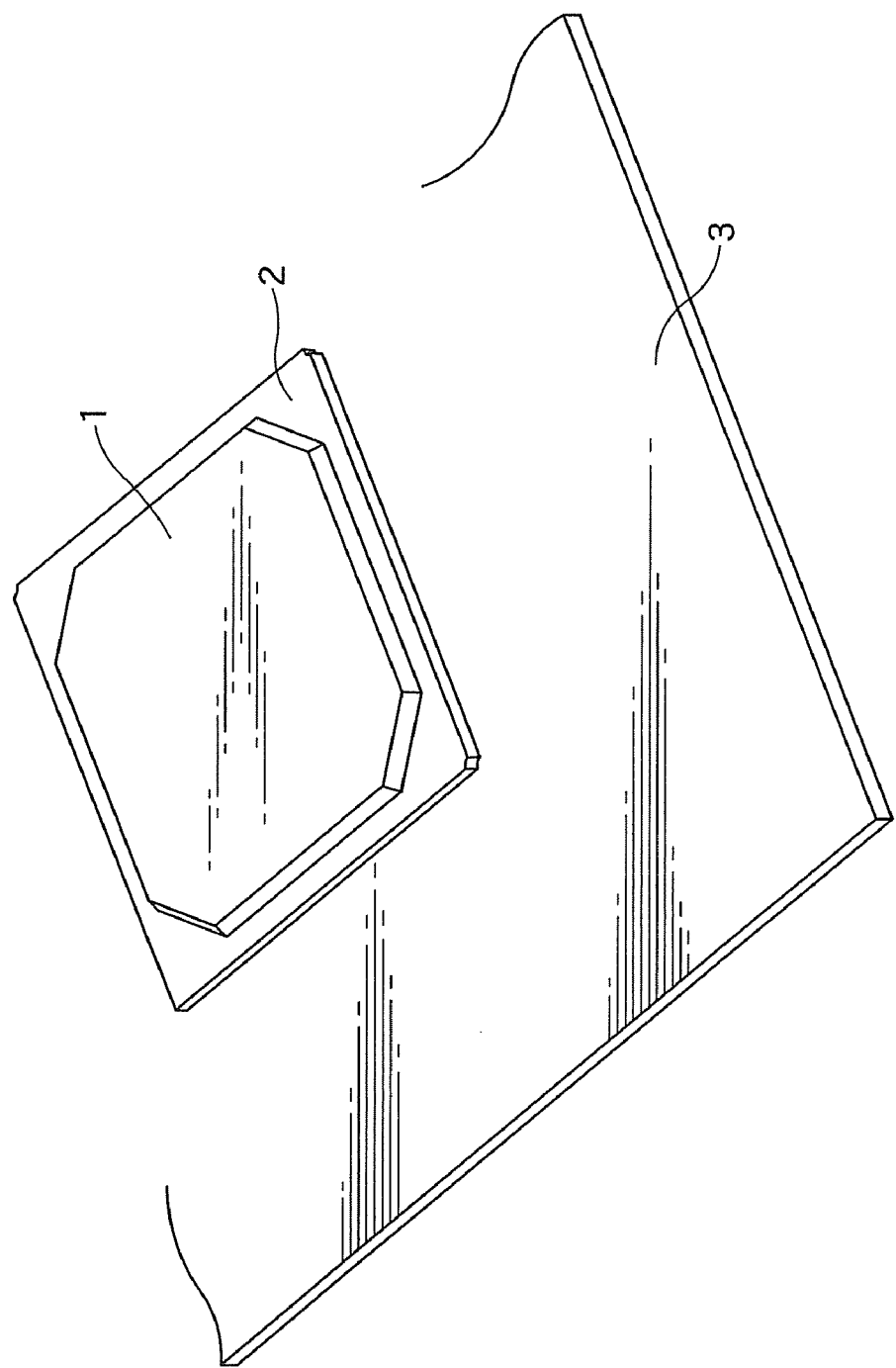
FIG. 2 is a perspective diagram showing a partial structure of a package including the monitoring system of FIG. 1.
Figure 3:
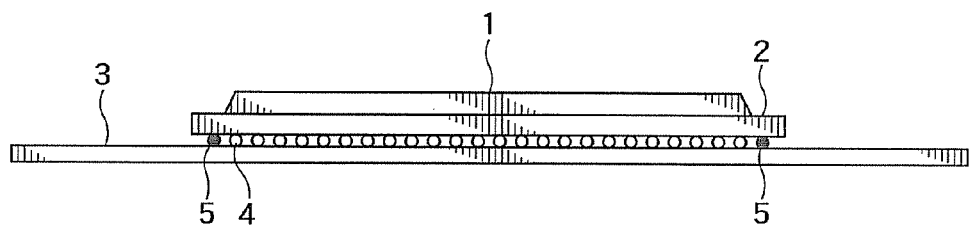
FIG. 3 is a side view showing the structure of FIG. 2.

FIG. 2 is a perspective diagram showing a partial structure of a package including the monitoring system of FIG. 1. FIG. 3 is a side view of the structure of FIG. 2. A substrate 2 having a BGA (Ball Grid Array) 1 mounted thereon is arranged on a circuit board 3. The substrate 2 having the BGA 1 thereon is mounted on the board 3 through a plurality of solder bumps (solder junctions). Although each of the elements 113 to 120 in the monitoring system of FIG. 1 is arranged in the BGA 1 in this case, these elements can be partially or entirely arranged outside the BGA 1. When the BGA 1 is in operation, the temperature of the BGA 1 can be measured by the temperature sensor 115. In the example shown in this case, both of the dummy component 112a and the target component 111a are the substrate 2 having the BGA 1 thereon.

Figure 4:
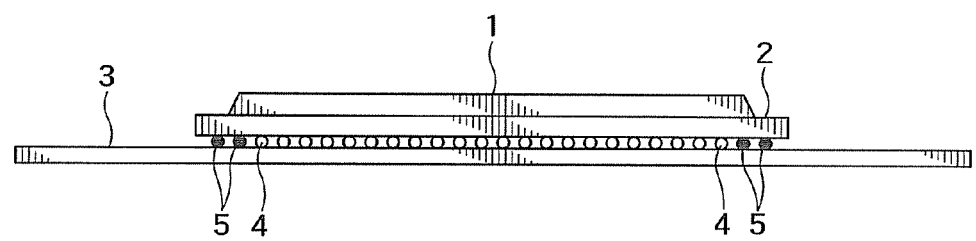
FIG. 4 is a diagram for explaining an example in which a plurality of dummy junctions are arranged to be adjacent to each other.

When the board 3 is transformed by expansion induced by heat (temperature variation) or a machine load (vibration, shock) from the outside, stress is generated in the solder junctions connecting the substrate 2 and the board 3. The stress generated in the solder junctions induces metal fatigue corresponding to the magnitude of the stress, and the stress repeatedly generated breaks the solder junctions in the end. When connection is performed as shown FIG. 2 and FIG. 3, the greatest stress is generated in the solder bumps at the four corners. Since these corner bumps are inevitably broken earlier than the other bumps due to the arrangement, these corner bumps are generally placed as so-called dummy bumps, which are not used as signal lines or power source lines. Accordingly, as shown in FIG. 3, one or more bumps at the four corners are used as dummy bumps 5 (corresponding to the dummy junctions 112 of FIG. 1.) Further, one or more solder bumps other than the dummy bumps 5 are used as target solder bumps 4 (corresponding to the target junction 111 of FIG. 1) for estimating the lifetime thereof. The dummy bump 5 and the solder bump 4 (target junction 11) are previously related to each other. Note that only the bumps at the four corners may not be necessarily used as the dummy junctions 5. In a normal configuration, the bumps at the four corners are broken first, and the other bumps are sequentially broken from the outside to the inside. Accordingly, as shown in FIG. 4, when the bumps adjacent to the dummy bumps at the four corners are additionally used as the dummy bumps, calibration (correction), which will be explained later, can be repeated every time the bump is broken.

The temperature information database 116 of FIG. 1 records a variation history of the temperature detected by the temperature sensor 115 as temperature history data. The temperature information database 116 can record the temperature information at constant time intervals or at a predetermined timing (when a predetermined temperature is detected, for example). Note that time information can be recorded in addition to the temperature information.

The electrical characteristic measurer 113 measures electrical characteristics (resistance value, for example) of the target junction 111 and the dummy junction 112, and notifies the lifetime computing unit 114 of the results. The lifetime computing unit 114 judges that the junction is broken when its electrical characteristic (resistance value) is equal to or greater than a threshold value.

The lifetime computing unit 114 estimates the lifetime of the target junction 111 (estimates whether or not the target junction 111 reaches the end of the lifetime, or the length of the residual lifetime) based on the temperature variation history recorded in the temperature information database 116 by referring to each of the databases 117 to 119, which will be explained later. That is, the lifetime computing unit 114 acquires, based on the temperature variation history, a damage value of the target junction 111 (in this case, a temperature damage value showing an accumulated load induced by the temperature variation), and takes a predetermined action based on the judgment that the target junction 111 reaches the end of the lifetime when the acquired damage value reaches a first threshold value. For example, the lifetime computing unit 114 notifies a user that the target junction 111 reaches the end of the lifetime through an output unit serving as an interface with the outside.

Further, the lifetime computing unit 114 judges the existence or nonexistence of the break (failure) of the target junction 111 and the dummy junction 112 based on the electrical characteristics of the target junction 111 and the dummy junction 112 notified by the electrical characteristic measurer 113. When detecting the failure of the target junction 111, the lifetime computing unit 114 takes a predetermined action through the output unit.

On the other hand, when detecting the failure of the dummy junction 112, the lifetime computing unit 114 performs the steps of: acquiring a damage value of the dummy junction 112 (in this case, a temperature damage value induced by the temperature variation) based on the sensing history (temperature variation history) in the temperature information database 116; comparing the acquired damage value with a second threshold value (lifetime predictive value); and judging that influence of the first load (vibration in this case) other than the temperature variation is large when there is a large difference between the acquired damage value and the second threshold value (i.e. when the difference is equal to or greater than a predetermined value) in order to calculate a value showing the accumulated fatigue of the first load (load damage value) by using the databases 116 to 119. The lifetime computing unit 114 reflects the calculated load damage value to the estimated lifetime of the target junction 111, and calibrates (corrects) the estimated lifetime of the target junction 111. That is, a value showing the accumulated fatigue of the first load applied to the target junction 111 (load damage value) is estimated based on the load damage value calculated for the dummy junction 112 and the database 117, which will be explained later, and the lifetime is estimated by considering that the accumulated fatigue of the estimated load damage value, in addition to the accumulated fatigue of the temperature damage value, is applied to the target junction 111. Concretely, this estimated load damage value is used so that the first threshold value is changed (made smaller) to a value corresponding to the estimated load damage value.

The detailed operation of the lifetime computing unit 114 will be explained later, and now the complex load database 117, the sensor temperature/junction strain database 118, and the fatigue characteristic database 119, which are used in the computing performed by the lifetime computing unit 114, will be explained.

First, the fatigue characteristic database 119 will be explained.

The fatigue characteristic database 119 stores functions, parameters, etc. for calculating the damage values of the dummy junction 112 and the target junction 111. Material breakdown due to fatigue is determined by the value of a strain amplitude (i.e. magnitude of variation of strain value) and the number of cycles. Typically, Coffin-Manson rule (the cycle number is approximately $10^3$ or smaller), Basquine rule (the cycle number is approximately $10^4$ or greater), etc. are known as expressed as in the following Formula (1). In Miner's rule, it is considered that breakdown occurs when the damage value reaches a constant value (1 in Miner's rule) even in a case where different kinds of loads such as heat, vibration, and shock multiply act (see the formula of $D_{th}+D_v=1$ in FIG. 6, which will be explained later.)

Figure 5:
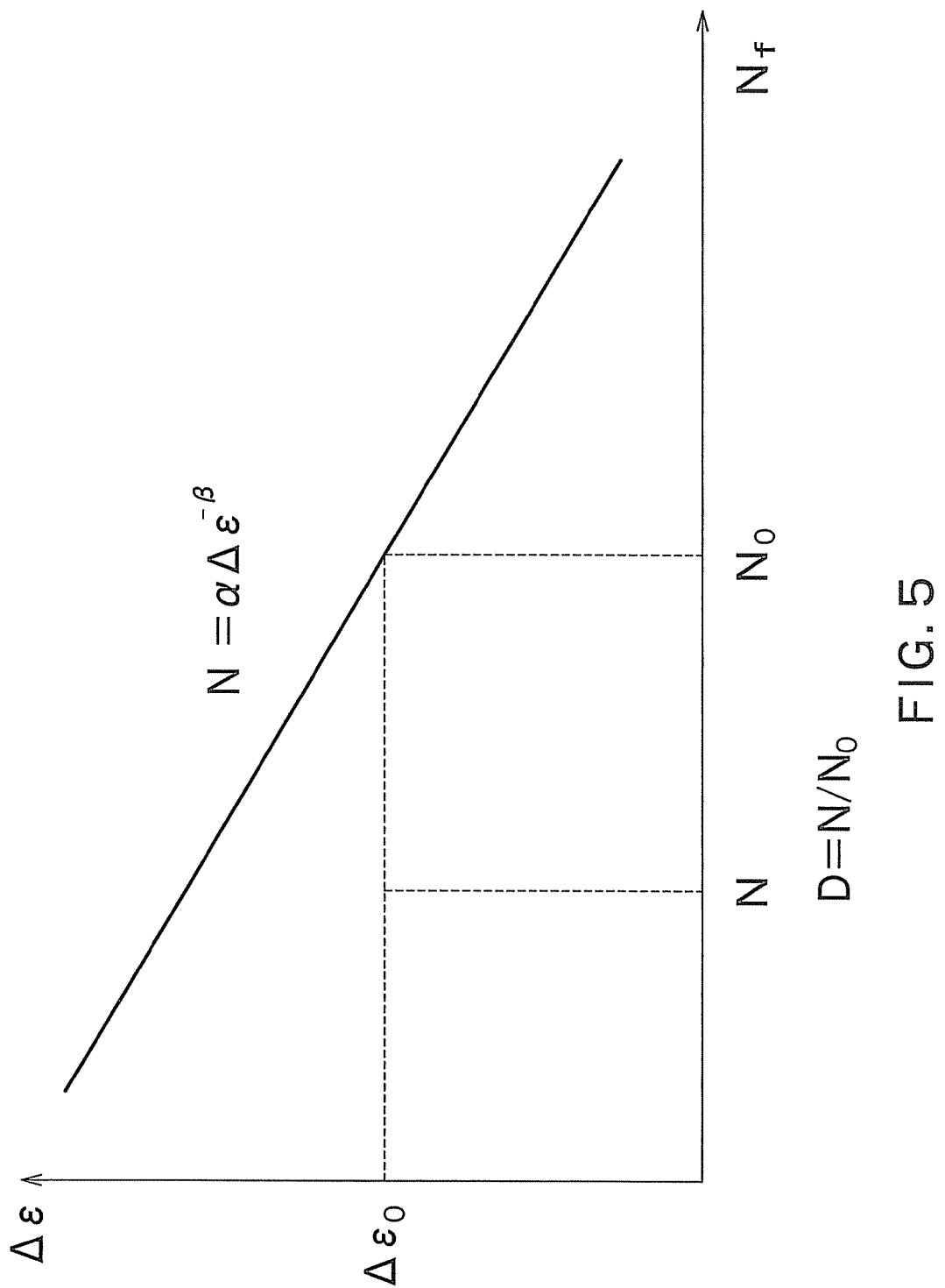
FIG. 5 is a diagram for explaining Formula (1) and Formula (2).

As an example, a complex load consisted of temperature variation and vibration will be considered. It is assumed that a damage value induced by the temperature variation is $D_{th}$, a damage value induced by the vibration is $D_v$, and the damage value $D_{th}$ or $D_v$ is 1 when breakdown occurs due to the load corresponding only any one of the temperature variation and the vibration. Under Miner's rule, when different kinds of loads multiply act and the sum of the damage values $D_{th}$ and $D_v$ becomes 1 (i.e. the following Formula (3) holds), breakdown occurs. Note that FIG. 5 shows the relationship between Formula (1) and Formula (2).

$$N_f = \alpha \Delta \epsilon^{-\beta} \tag{1}$$

$$D = N/N_f \tag{2}$$

$\Delta \epsilon$: A strain amplitude $\alpha, \beta$: A constant determined by the material $N_f$: A crack occurrence cycle number (lifetime cycle number by which a strain amplitude $\Delta \epsilon$ is applied until the crack occurs)

N: A cycle number by which the strain amplitude $\Delta \epsilon$ is actually loaded (repetition cycle number)

D: A damage value (proportion of the cycle number accumulated up to the present to the lifetime cycle number)

$$D_{th} + D_v = 1 \tag{3}$$

$$D_{th} = N_{th}/N_{f,th} \tag{4}$$

$$N_{f,th} = \alpha \Delta \epsilon_{th}^{-\beta} \tag{5}$$

$$D_v = N_v/N_{f,v} \tag{6}$$

$$N_{f,v} = \alpha \Delta \epsilon_v^{-\beta} \tag{7}$$

$D_{th}, D_v$: A damage value induced by temperature variation (temperature damage value), a damage value induced by vibration (vibration damage value)

$N_{th}, N_v$: A cycle number by which each of a strain amplitude $\Delta \epsilon_{th}$ induced by temperature variation and a strain amplitude $\Delta \epsilon_v$ induced by vibration is actually loaded (repetition cycle number)

$N_{f,th}, N_{f,v}$: the crack occurrence cycle number with respect to each of the strain amplitude $\Delta \epsilon_{th}$ induced by temperature variation and the strain amplitude $\Delta \epsilon_v$ induced by vibration In the present embodiment, the strain amplitude $\Delta \epsilon$ has a constant value. However, even when the strain amplitude has a general wave pattern, the damage value can be essentially similarly calculated by summing the damage values each of which is obtained by the strain amplitude and its repetition cycle number, as shown in the following Formula (8).

$$D_{sum} = N_1/N_{f,1} + N_2/N_{f,2} + \ldots + N_n/N_{f,n} = N_1/\alpha\Delta\epsilon_1^{-\beta} + N_2/\alpha\Delta\epsilon_2^{-\beta} + \ldots N_n/\alpha\Delta\epsilon^{-\beta} \tag{8}$$

$D_{sum}$: A damage value when different strain amplitude is applied $\Delta \epsilon_1 \ldots \Delta \epsilon_n$: A strain amplitude $N_1 \ldots N_n$: A cycle number by which each of strain amplitudes $\Delta \epsilon_1, \ldots \Delta \epsilon_n$ is loaded The relationships based on the Formulas (1) to (7) (and (8)) for each of the dummy junction 112 and the target junction 111 are previously acquired and are stored in the fatigue characteristic database 119 as stated above. The relationships based on Formulas (5) and (7), each of which predicts the lifetime when loads are not made complex, are acquired by a material test etc. using the solder bump.

The set of Formulas (4) and (5) (functions for calculating the temperature damage value) relating to the dummy junction 112 corresponds to a dummy damage function of the present invention, while the set of Formulas (4) and (5) (functions for calculating the temperature damage value) relating to the target junction 111 corresponds to a target damage function of the present invention.

Next, the complex load database 117 will be explained.

As stated above, under Miner's rule, breakdown occurs in the state of Formula (3) (the sum of the damage values induced by the respective loads is 1.) However, actually, breakdown frequently occurs before the sum of the damage values induced by the respective loads reaches 1 when multiple loads act. Accordingly, used in the present embodiment is a technique obtained by improving Miner's rule (Formula (3)).

Figure 6:
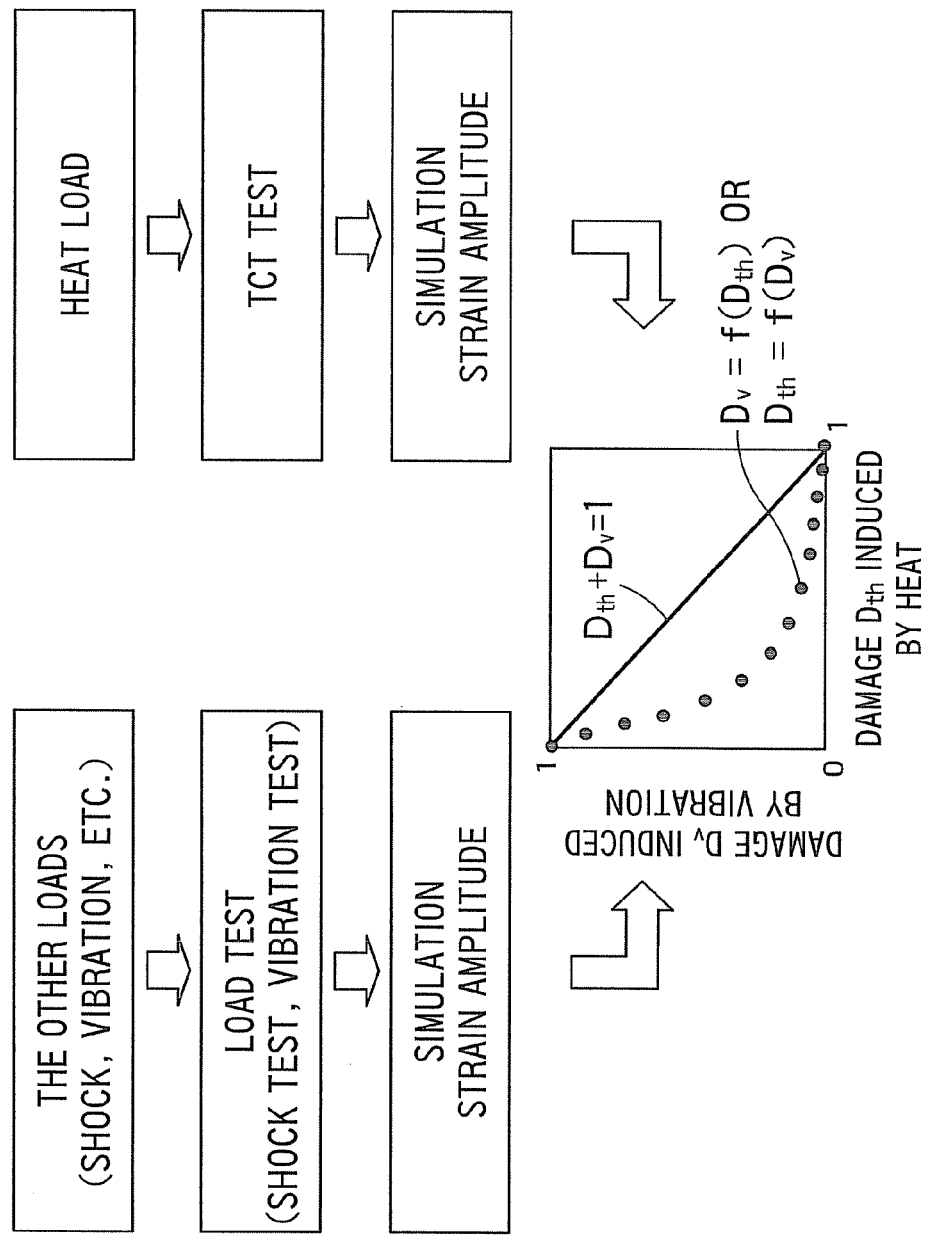
FIG. 6 is a diagram for explaining schematically a method for creating relation data between a temperature damage value and a vibration damage value.

That is, as shown in FIG. 6, the time until the occurrence of breakdown induced by multiple loads is previously measured by combining a test and a numerical simulation (such as a finite element method), and the relationship of the following Formula (9) (see the broken line graph FIG. 6) acquired for each of the dummy junction 112 and the target junction 111 is stored in the complex load database 117. In the present embodiment, not Formula (3) but the function of Formula (9) (complex load function) is used in various kinds of computing (lifetime calibration), which will be explained later.

$$D_{th}=f(D_v) \text{ or } D_v=f(D_{th}) \qquad (9)$$

Here, $f(D_{th})$ is a function for returning a damage value induced by temperature variation when the damage value $D_v$ induced by vibration is given, while $f(D_v)$ is a function for returning the damage value $D_{th}$ induced by vibration when a damage value induced by temperature variation is given. That is, based on Formula (9), when one of the damage value $D_{th}$ induced by temperature variation and the damage value $D_v$ induced by vibration is determined, the other damage value at which breakage occurs is uniquely determined.

At this time, as shown in the coordinate system of FIG. 6, the residual lifetime is defined as the distance between the present damage value (coordinate) and the point determined by the function of $D_{th}=f(D_v)$ (or $D_v=f(D_{th})$). The damage value $D_{th}$ or $D_v$ becomes closer to the point obtained by the function of $D_{th}=f(D_v)$ (or $D_v=f(D_{th})$) as the damage becomes greater, and breakage occurs when the damage value $D_{th}$ or $D_v$ reaches the point obtained by the function of $D_{th}=f(D_v)$ (or $D_v=f(D_{th})$).

For example, Formula (9) relating to the dummy junction 112 corresponds to dummy lifetime data of the present invention, while the Formula (9) relating to the target junction 111 corresponds to target lifetime data of the present invention. The dummy lifetime data and the target lifetime data may be recorded in a lookup table in which the damage values $D_v$ and $D_{th}$ are related to each other. Note that, when the values $D_v$ and $D_{th}$ is not partially existent in the table, an interpolation process may be performed such as a linear interpolation using the previous and next data of the one value.

Figure 7:
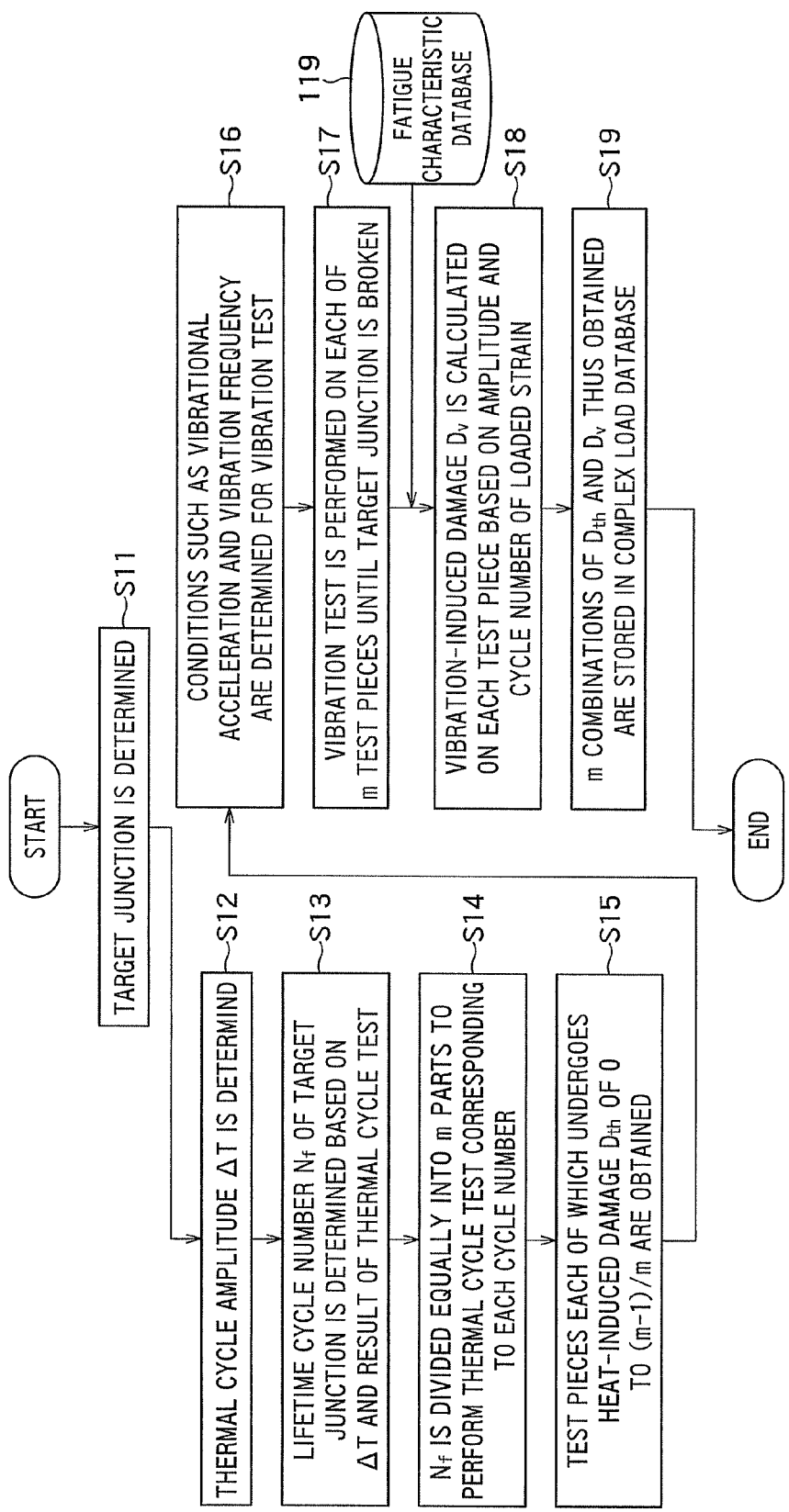
FIG. 7 is a flow chart showing an example of detailed process steps of a method for creating the relational data concerning a target junction.
Figure 8:
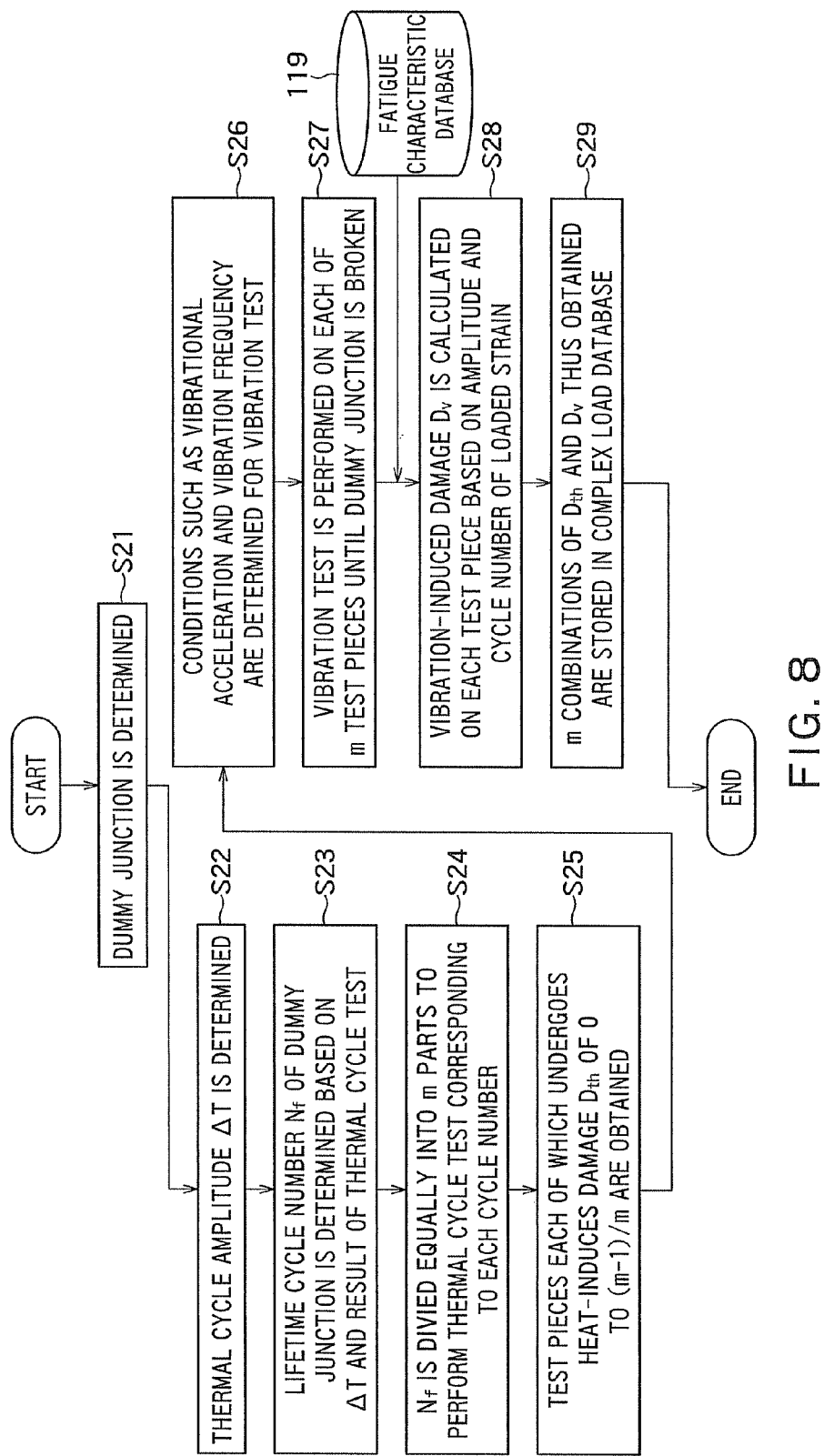
FIG. 8 is a flow chart showing an example of detailed process steps of a method for creating the relational data concerning a dummy junction.

FIG. 7 is a flow chart for explaining a method for creating the complex load function (target lifetime data) of the target junction 111. FIG. 8 is a flow chart for explaining a method for creating the complex load function (dummy lifetime data) of the dummy junction 112. Since the flow of FIG. 7 and that of FIG. 8 are the same excepting that the target of the complex load function to be generated is different, hereinafter, only the explanation of FIG. 7 will be made and the explanation of FIG. 8 will be omitted in order to avoid a duplicate description. Note that S21 to S29 in FIG. 8 correspond to S11 to S19 in FIG. 7, respectively.

Figure 9:
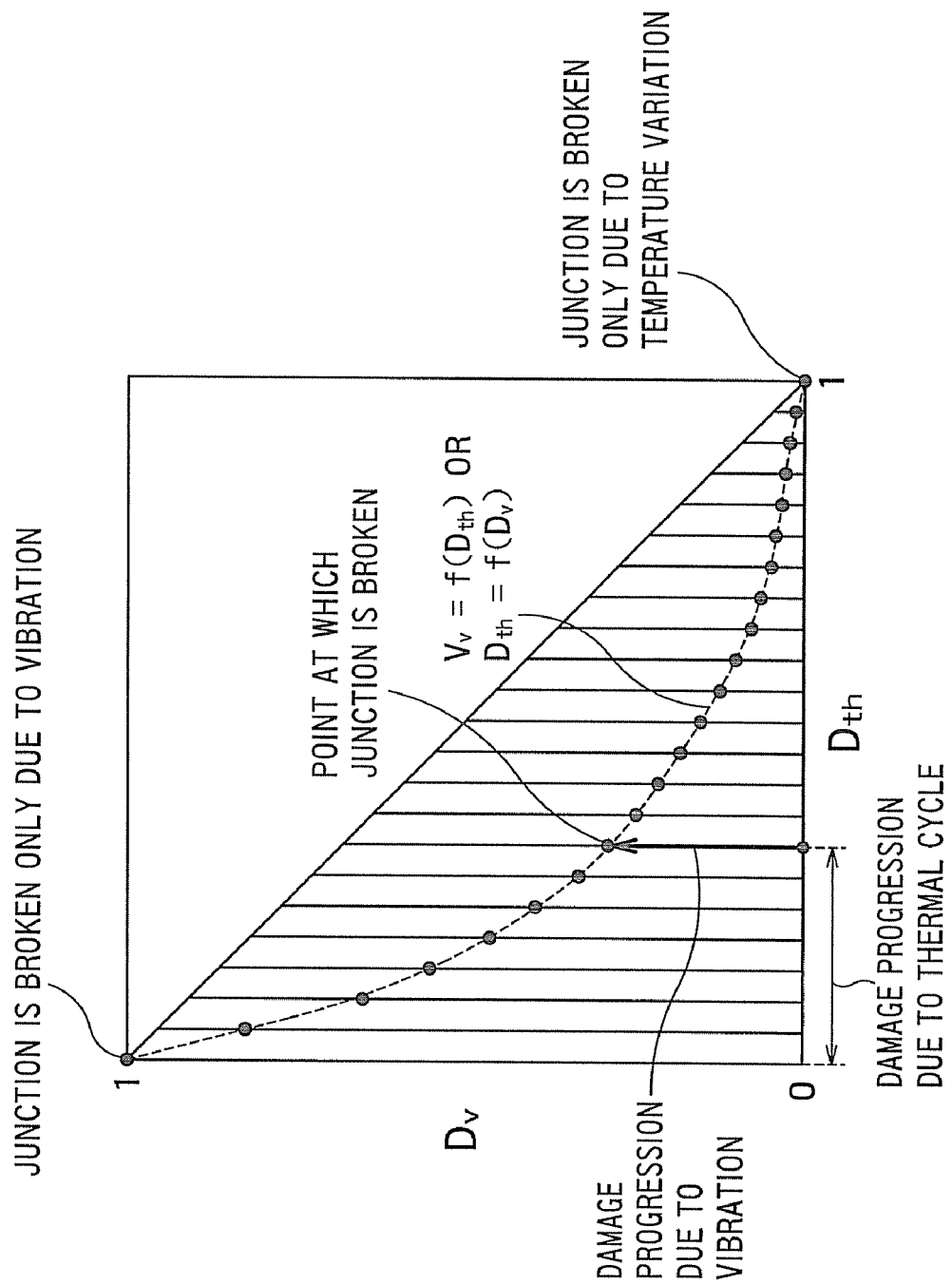
FIG. 9 is a diagram for giving a supplementary explanation for the process steps of FIG. 7 and FIG. 8.

First, a thermal cycle test is performed until break is detected by using a predetermined thermal cycle amplitude to determine a lifetime thermal cycle $N_f$ (S11 to S13). The lifetime thermal cycle $N_f$ is divided equally into m parts to create test pieces each of which undergoes damage having a damage value of the thermal cycle of each of 0 to $(m-1)/m$ (S14 and S15). A vibration test is performed on each of the test pieces as shown in FIG. 9 to obtain the relationship between the damage induced by heat and that induced by vibration, and the test is performed until the target junction is broken (S16 and S17). The strain amplitudes $\Delta\epsilon_{th}$ and $\Delta\epsilon_v$ to break and the cycle numbers $N_{f,th}$ and $N_{f,v}$ are obtained based on the thermal cycle test, the vibration test, and a finite element analysis, which will be explained later. Further, the damage values $D_{th}$ and $D_v$ to break can be obtained based on the relationships of Formulas (4) to (7) (S18 and S19).

Figure 10:
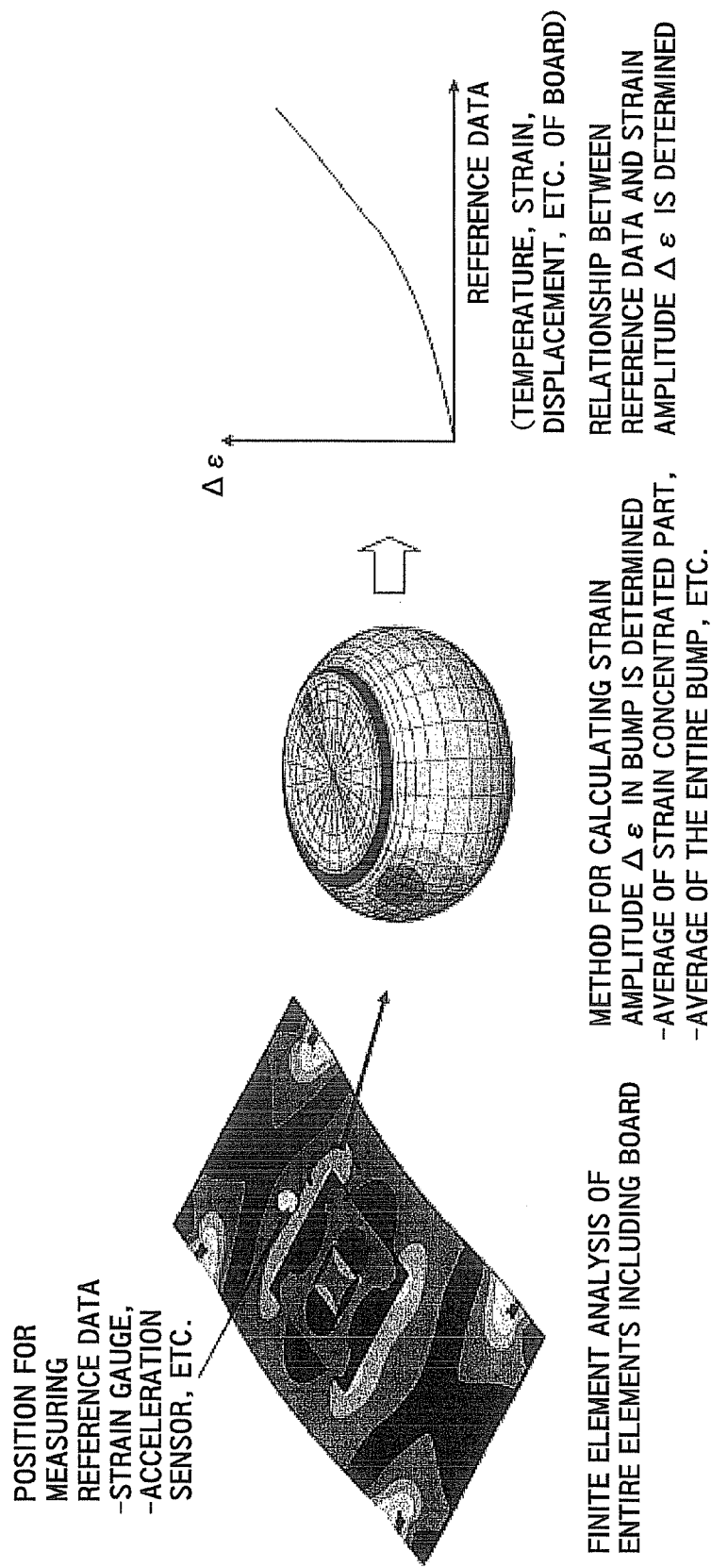
FIG. 10 is a diagram for explaining a calculation method of a strain amplitude.

When performing the vibration test and the thermal cycle test, it is desirable to mount a strain gauge, an acceleration sensor, etc. on the board to measure the physical quantity around the a bump serving as a prediction target so that the history of the strain amplitude $\Delta\epsilon$ loaded through vibration is obtained. When only the strain amplitude is to be obtained, the strain amplitude $\Delta\epsilon$ can be obtained by a simulation based on the finite element method, which is because the entire transformation form is uniquely determined when a boundary condition (temperature, vibrational acceleration) to be inputted is determined. However, when the information of physical quantity such as strain, acceleration, etc. measured near the bump is obtained in addition to the boundary condition, the strain amplitude can be obtained more accurately based on the method of FIG. 10. When the dummy bump (dummy junction) and the target bump (target junction) have the same form as in the present embodiment, the database to be obtained becomes theoretically the same if the same method is used to determine the strain amplitude $\Delta\epsilon$ of the bump in the process of FIG. 10. Accordingly, it is not necessary to create both of the lifetime data for the dummy bump (dummy junction) and the target bump (target junction), which means that it is possible to create only one of them and apply the created one to the other. However, it is desirable to create both of them since the bump actually includes various errors such as a shape error and a measuring error.

The complex load database 117 stores, in addition to the dummy lifetime data and the target lifetime data (see Formula (9)), load correspondence data representing the relationship between the damage value $D_v$ induced by the first load (vibration in this case) of the dummy junction 112 and the damage value $D_v$ induced by the first load (vibration in this case) of the target junction 111. For example, when the damage value $D_v$ of the dummy junction 112 is obtained, the load correspondence data makes it possible to estimate the damage value $D_v$ of the target junction 111 by specifying a value corresponding to the damage value D. Such a method for creating the load correspondence data will be explained in detail later.

Figure 11:
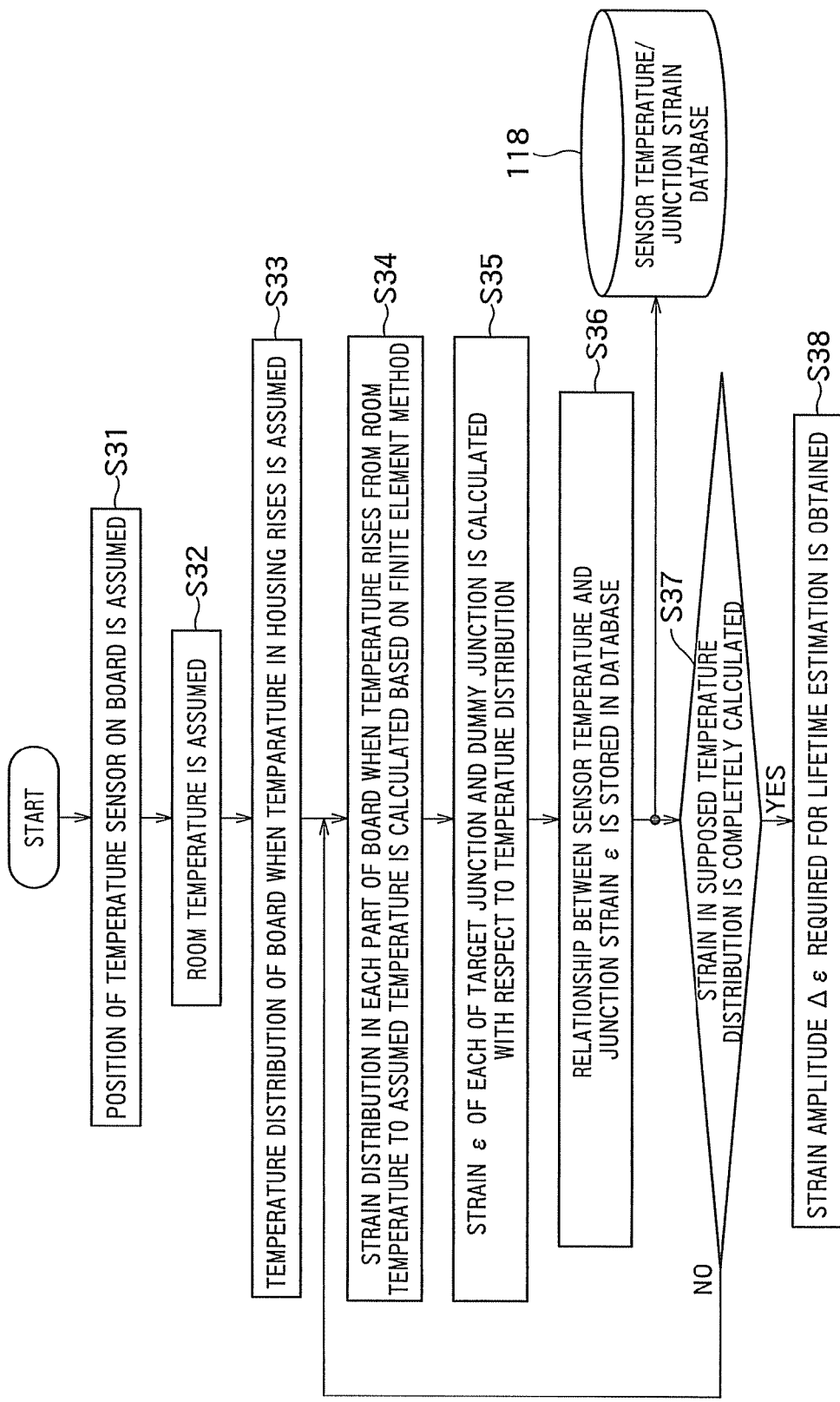
FIG. 11 is a flow chart for explaining a method for generating a sensor temperature/junction strain database.

The sensor temperature/junction strain database 118 stores values of strain generated in the target junction 111 and the dummy junction 112 with respect to each of a plurality of temperatures (sensor temperatures.) The flow chart of FIG. 11 shows an example of the method for generating the sensor temperature/junction strain database 118. FIG. 11 shows the steps of: assuming the position of the temperature sensor on the board (S31); assuming room temperature (S32); assuming temperature distribution of the board when temperature in a housing rises (S33); calculating, based on the finite element method, strain distribution in each part of the board when the temperature rises from the room temperature to an assumed temperature (S34); calculating the strain $\epsilon$ of each of the target junction and the dummy junction (S35); storing the relationship between the sensor temperature and the strains $\epsilon$ in the database 118 (S36); and repeating the steps S31 to S36 until the strain in a supposed temperature distribution is completely calculated (S37). Further, by using the database 118 thus obtained, the strain amplitude $\Delta\epsilon$ required for the lifetime estimation performed by the lifetime computing unit 14 can be obtained (S38).

Here, a supplementary explanation will be made on the method for calculating the strain amplitude $\Delta\epsilon$. The above-mentioned Formula (5), Formula (7), etc. are relational expressions for estimating a normal crack occurrence lifetime, and generally, the estimated lifetime is frequently different from the actual lifetime until the junction is broken due to the penetrate of a crack (solder junction) of an electronic component. Generally, in order to make the estimated lifetime consistent with the actual lifetime induced by break, a constant values such as a and β is additionally used or the method for calculating the strain amplitude Δε is changed. In the present embodiment, the method for calculating the strain amplitude Δε is determined in accordance with the method shown in the flow chart of FIG. 12. That is, the Δε required for the lifetime estimation is calculated by the calculation method determined by the method of FIG. 12. The strain amplitude Δε is an amount unmeasurable from the actual bump, is determined by performing a simulation such as the finite element method. However, there is no method particularly specified to determine the strain amplitude of the bump (see FIG. 10), and the strain amplitude is determined corresponding to the actual phenomenon. For example, it may be appropriate to use the averaged strain of some elements surrounding the place which has the largest strain, or to use the averaged strain of the entire bump. A method showing the value nearest to the actual lifetime is employed from these methods.

Figure 12:
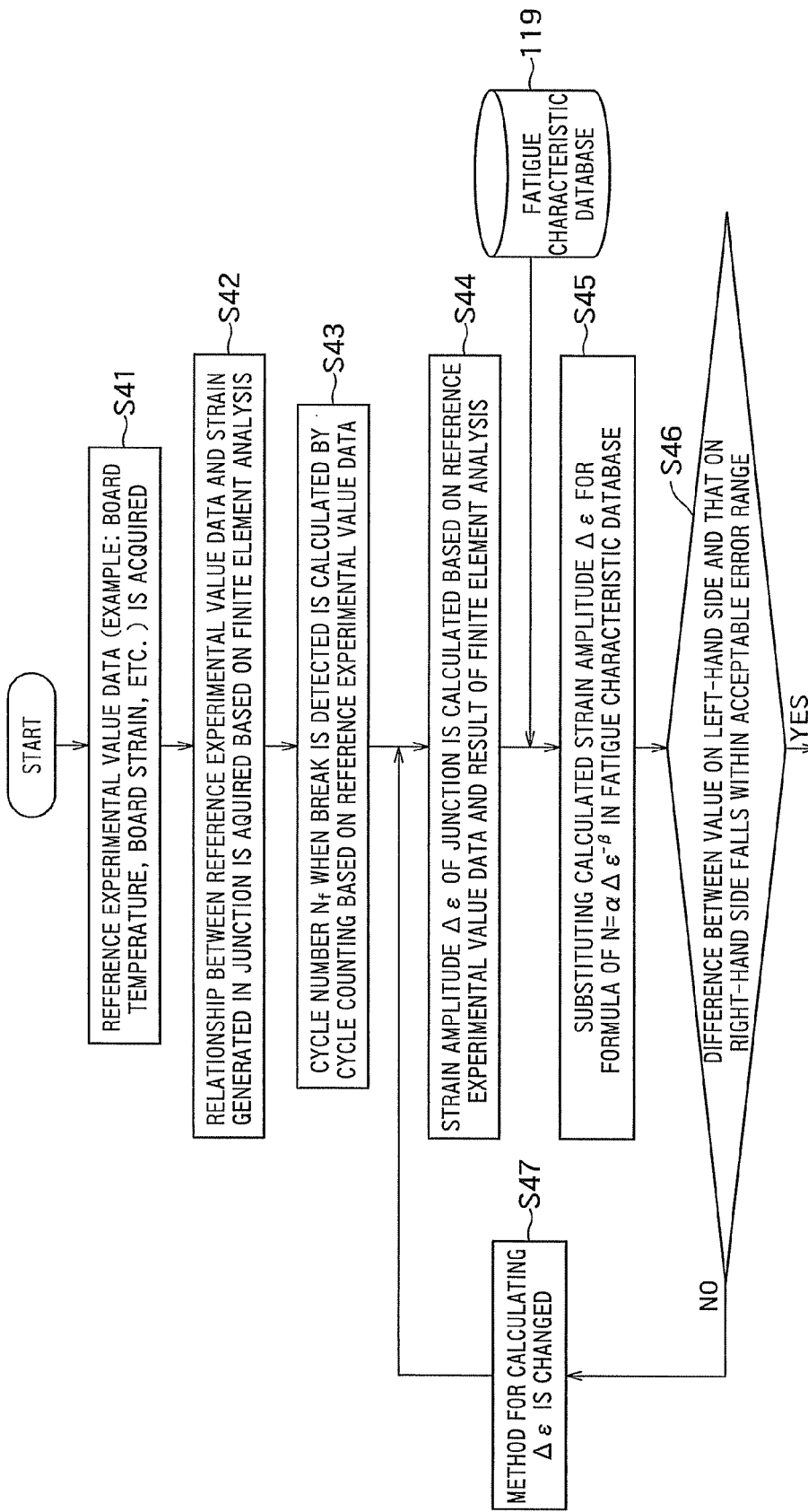
FIG. 12 is a flow chart showing a process flow for determining the calculation method of the strain amplitude.

The flow of FIG. 12 shows the steps of: acquiring reference experimental value data (board temperature, board strain, etc.) (S41); acquiring the relationship between the reference experimental value data and the strain generated in the junction based on the finite element analysis (S42); calculating the cycle number $N_f$ when break is detected by the cycle counting based on the reference experimental data (S43); calculating the strain amplitude Δε of the junction based on the reference experimental data and the result of the finite element analysis (S44); substituting the calculated strain amplitude Δε for the formula of $N_f = a\Delta\epsilon^{-\beta}$ in the fatigue characteristic database 119 (S45); and employing the calculation method used in step S44 when the difference between the value on the left-hand side and that on the right-hand side of this formula is within an acceptable error range, and changing the method for calculating the Δε when the difference is not within the acceptable error range (S47) and the flow returns back to step S44.

The lifetime computing unit 114 converts the temperature variation history stored in the temperature information database 116 into a strain history by referring to the sensor temperature/junction strain database 118, and calculates the damage value (temperature damage value) of the target junction 111 by using the fatigue characteristic database 119. In a similar way applied to the target junction 111, the lifetime computing unit 114 calculates the damage value (temperature damage value) of the dummy junction 112. The lifetime computing unit 114 stores, in the damage information database 120, the damage values (temperature damage value) calculated for each of the target junction 111 and the dummy junction 112.

When the damage value (temperature damage value) of the target junction 111 reaches the first threshold value (initial value is 1), the lifetime computing unit 114 judges that the target junction 111 reaches the end of the lifetime, records the information in the damage information database 120, and takes a predetermined action (see the flow of FIG. 13, which will be explained later.) Further, when detecting the break of the dummy junction 112 based on the notification from the electrical characteristic measurer 113, the lifetime computing unit 114 calculates the temperature damage value of the dummy junction 112. When the difference between the calculated temperature damage value and the second threshold value (1 in this case) is smaller than a predetermined value (an arbitrary real number of 0 or greater), the lifetime computing unit 114 judges that the influence of a load (vibration in this case) other than the temperature variation is not existent or negligible, and determines not to calibrate (correct) the lifetime of the target junction 111 (see NO branch of S64 in the flow of FIG. 14, which will be explained later.)

On the other hand, when the above difference is equal to or greater than the predetermined value, the lifetime computing unit 114 judges that the influence by a non-negligible load (vibration in this case) other than the temperature variation is large, and calibrates (corrects) the lifetime of the target junction 111 (see S66 in the flow of FIG. 14, which will be explained later.) That is, based on the damage value (temperature damage value) of the dummy junction 112, the damage value (vibration damage value) applied to the dummy junction 112, which is due to a load other than the temperature variation, is estimated by referring to the dummy lifetime data (see Formula (9)) and the load correspondence data in the complex load database 117. Then, the lifetime computing unit 114 specifies the temperature damage value corresponding to the vibration damage value based on the target lifetime data of the complex load database 117 (see Formula (9)), and changes the first threshold value to the obtained temperature damage value. Subsequently, the lifetime estimation is performed by judging whether or not the temperature damage value reaches the end of the changed first threshold value. As stated above, the lifetime can be estimated (calibrated) by additionally taking the influence of an external force (load) other than the temperature variation into consideration.

Figure 13:
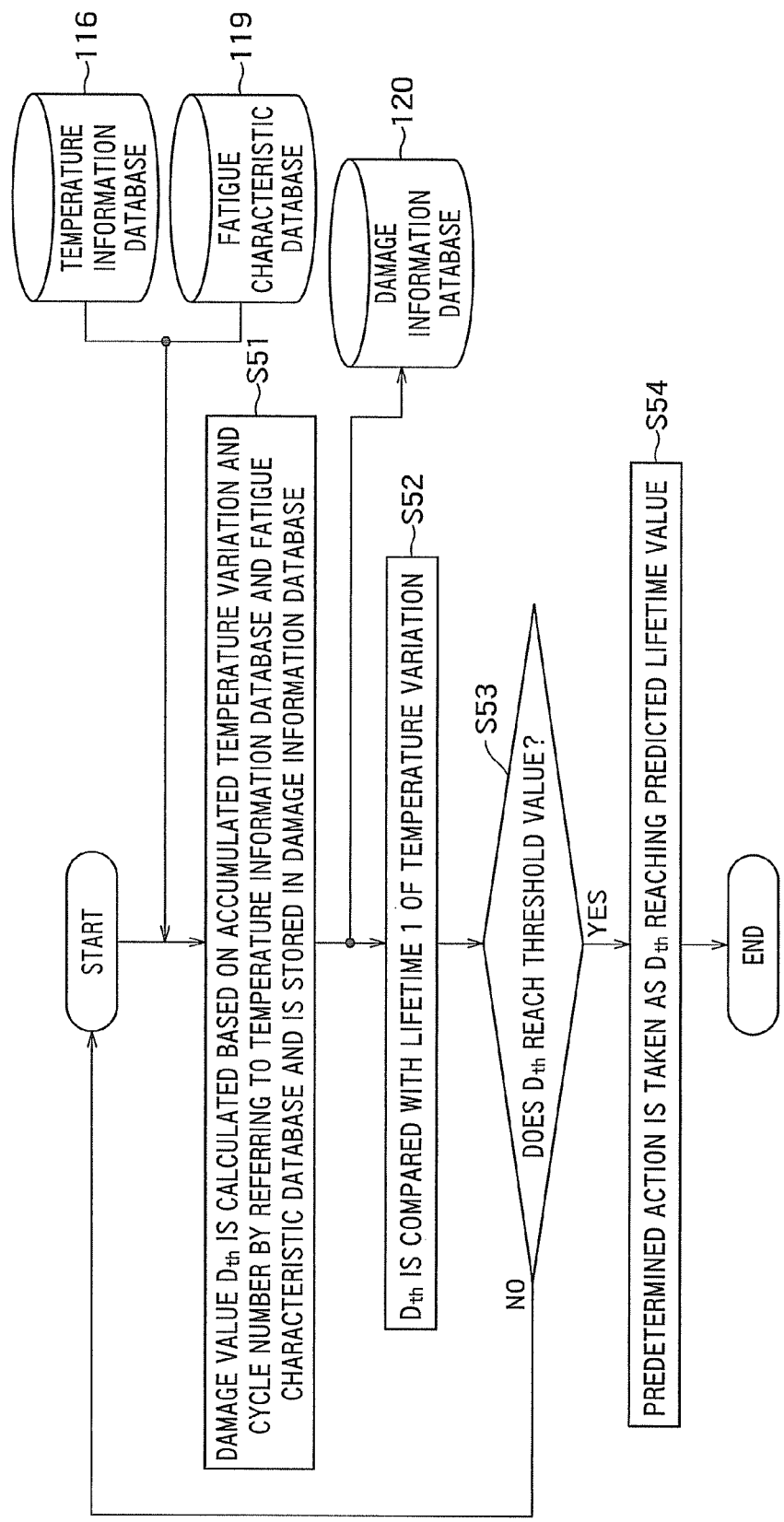
FIG. 13 is a flow chart showing steps of a lifetime estimation routine by using a lifetime computing unit.

FIG. 13 is a flow chart showing steps of the lifetime estimation routine by using the lifetime computing unit 114.

The lifetime estimation is periodically performed when any event occurs. For example, such an event indicates when a power source is turned ON, or when temperature rises up to an alarm temperature or greater.

The lifetime computing unit 114 calculates the damage value $D_{th}$ based on the accumulated temperature variation and cycle number by referring to the temperature information database 116 and the fatigue characteristic database 119, and stores the calculated damage value $D_{th}$ in the damage information database 120 (S51.)

The lifetime computing unit 114 compares the damage value $D_{th}$ with the predicted lifetime value (first threshold value) (S52), and judges whether or not the damage value $D_{th}$ reaches the predicted lifetime value (S53). At this point, the predicted lifetime value (first threshold value) is 1 (temperature damage value when the vibration damage value $D_v$ is 0 in the target lifetime data.) The lifetime computing unit 114 judges that the lifetime is nearly or actually exhausted when the damage value $D_{th}$ reaches the first threshold value, and takes a predetermined action (S54). When the damage value $D_{th}$ does not reach the first threshold value, the flow returns back to step S51. The predetermined action is, for example, performing maintenance for enterprise use, or notifying the user of the contact information for support. In this way, a sign of a phenomenon conventionally handled as an accidental failure can be previously detected, which makes it possible to take the next action rapidly. Although in the present step, whether or not the damage value $D_{th}$ reaches the first threshold value is judged, alternatively, it is also possible to take a predetermined action when the difference between the damage value $D_{th}$ and the first threshold value is judged to be equal to or smaller than a predetermined value, or to make the flow back to step S51 when the difference between the damage value $D_{th}$ and the first threshold value is judged to be equal to or greater than the predetermined value.

Figure 14:
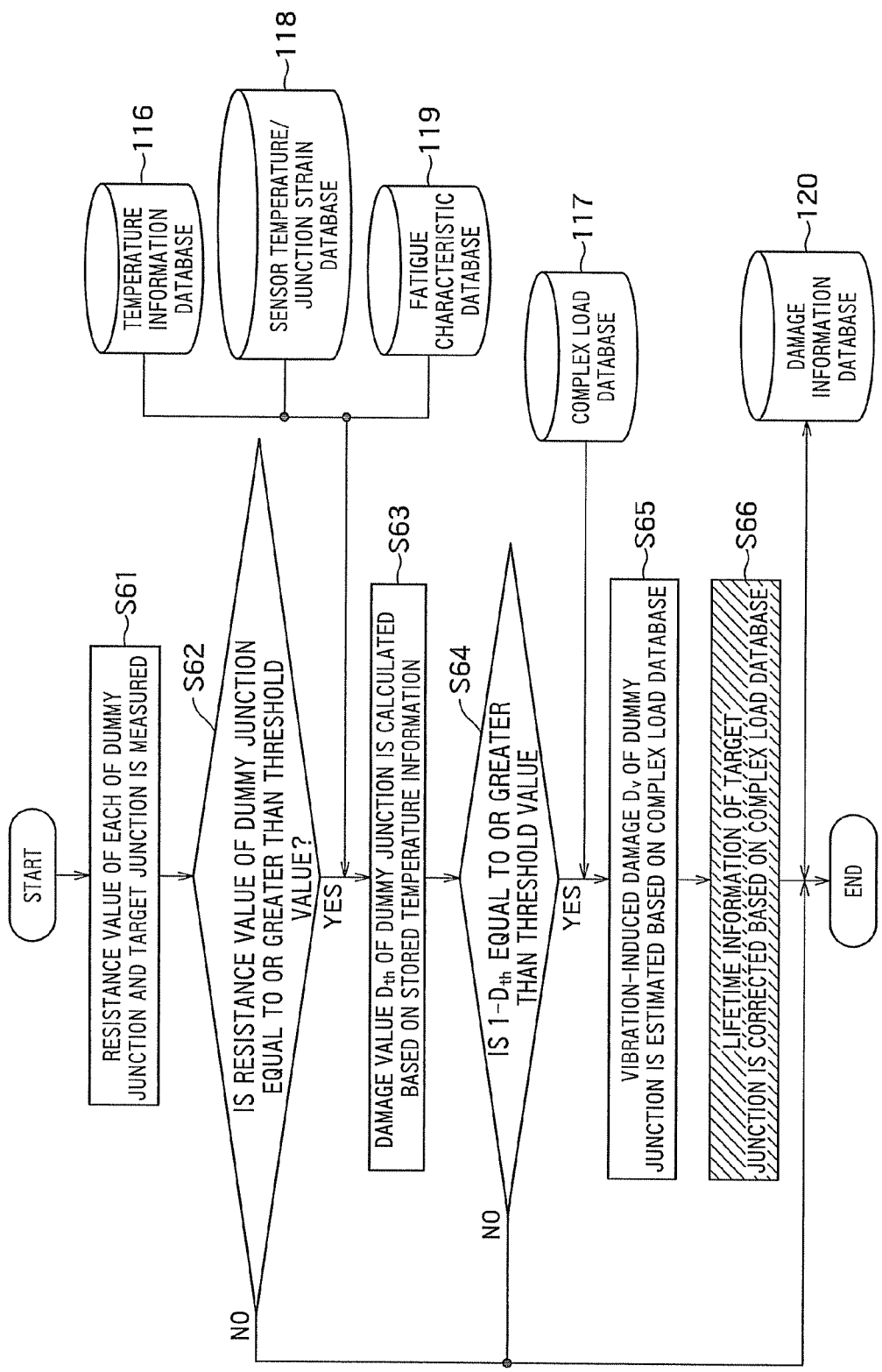
FIG. 14 is a flow chart showing steps for calibrating (correcting) the lifetime of the target junction.

FIG. 14 is a flow chart showing the steps for calibrating (correcting) the lifetime of the target junction 111 when the lifetime computing unit 114 detects the break of the dummy junction 112.

The lifetime computing unit 114 periodically acquires the electrical characteristics (resistance value in this case) of the dummy junction 112 and the target junction 111 through the electrical characteristic measurer 113 (S61). The lifetime computing unit 114 examines whether or not the resistance value of the dummy junction 112 is equal to or greater than the threshold value (S62), and does not calibrate the lifetime of the target junction 111 based on the judgment that the dummy junction 112 is not broken when the resistance value is not equal to or greater than the threshold value. Further, the lifetime computing unit 114 takes a predetermined action based on the judgment that the target junction 111 fails when the resistance value of the target junction 111 is equal to or greater than the threshold value, and takes no action when the resistance value of the target junction 111 is smaller than the threshold value.

On the other hand, when the resistance value of the dummy junction 112 is equal to or greater than the threshold value, the lifetime computing unit 114 calculates the cycle number of the strain amplitude $\Delta\epsilon$ by referring to the temperature history data stored in the temperature information database 116 and the sensor temperature/junction strain database 118, and calculates the temperature damage value $D_{th}$ of the dummy junction 112 based on the dummy damage functions (Formulas (4) and (5)) in the fatigue characteristic database 119 and the calculated cycle number (S63).

The lifetime computing unit 114 compares the lifetime predictive value (second threshold value) 1 of the dummy junction 112 with the temperature damage value $D_{th}$ of the dummy junction 112, and examines whether or not the difference obtained by subtracting the damage value $D_{th}$ from the lifetime predictive value (second threshold value) 1 is equal to or greater than the predetermined value (S64). The lifetime predictive value (second threshold value) 1 is a temperature damage value when the vibration damage value $D_v$ is 0 in the dummy lifetime data. When the difference is smaller than the predetermined value, the lifetime computing unit 114 judges that the exhaustion of the lifetime of the dummy junction 112 is not influenced by a load other than the temperature variation, and does not calibrate (correct) the lifetime of the target junction 111 (that is, the first threshold value is not changed.) On the other hand, when the difference is equal to or greater than the predetermined value, the lifetime computing unit 114 judges that the failure of the dummy junction 112 is greatly influenced by an unsensed load (vibration in this case), and steps S65 and S66 for calibrating the lifetime of the target junction 111 are performed.

In step S65, the lifetime computing unit 114 estimates the damage value induced by vibration (vibration damage value) $D_v$ applied to the dummy junction 112 based on the dummy lifetime data in the complex load database 117 (see Formula (9).) That is, the damage value induced by vibration (vibration damage value) $D_v$ is obtained by giving the temperature damage value $D_{th}$ to Formula (9) with respect to the dummy junction 112. Then, in step S66, the lifetime of the target junction 111 is calibrated (corrected) based on the vibration damage value $D_v$ of the dummy junction 112 and the information of the complex load database 117 (load correspondence data and target lifetime data (see Formula (9))).

In more detail, required first in step S66 is to estimate the damage value induced by vibration applied to the target junction 111 based on the vibration damage value $D_v$ of the dummy junction 112. This estimation can be performed by using the load correspondence data in the complex load database 117 and by obtaining a value corresponding to the vibration damage value $D_v$ of the dummy junction 112 as the vibration damage value $D_v$ of the target junction 111. Then, the lifetime computing unit 114 obtains the temperature damage value corresponding to the vibration damage value $D_v$ of the target junction 111 based on the target lifetime data (see Formula (9)), and changes the threshold value (first threshold value) used in steps S52 and S53 in the lifetime estimation routine of FIG. 13 to the calculated temperature damage value. In this way, the lifetime estimation (lifetime calibration) can be achieved taking the influence of vibration applied to the target junction 111 into consideration.

Figure 16:
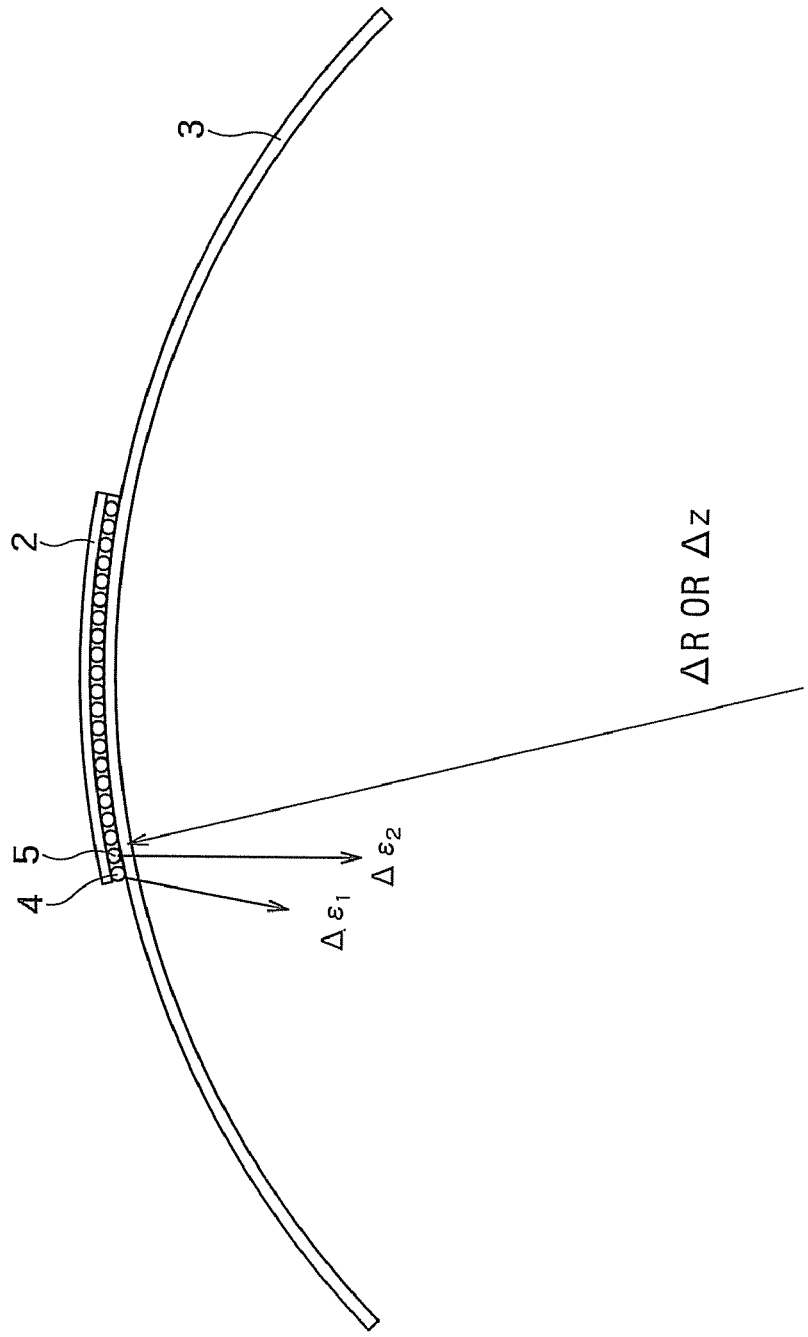
FIG. 16 is a diagram showing the relationship between a vibration form and a board form.
Figure 17:
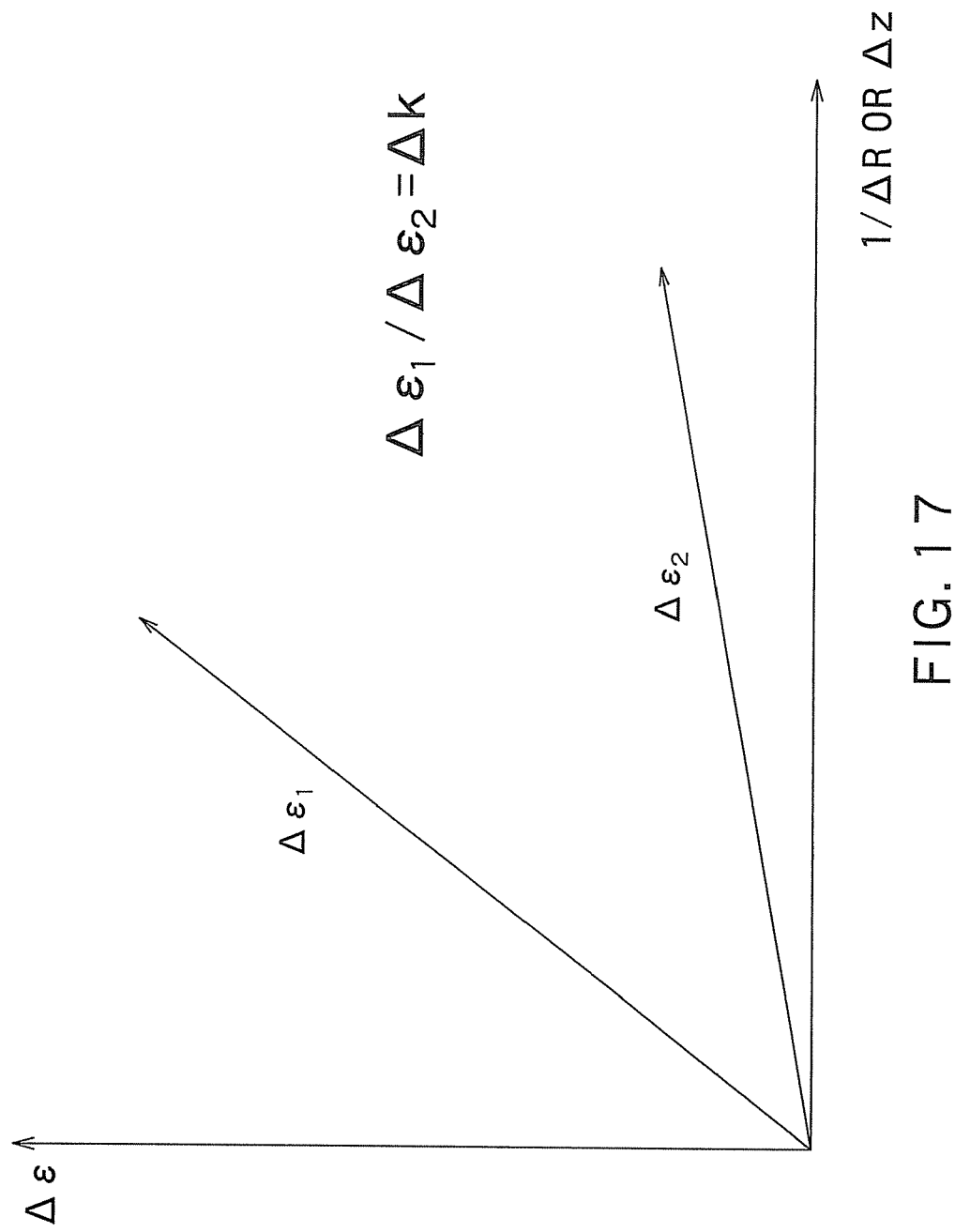
FIG. 17 is a diagram showing the relationship between a variation in a curvature radius and the strain amplitude and that between a variation in a displacement and the strain amplitude.

Hereinafter, the method for creating the load correspondence data will be explained by using FIGS. 16 to 18.

Generally, the load due to vibration applied to the junction is generated by a first natural vibration form (bending vibration) of the board, and the vibration form is uniquely determined in such a case. When the vibration form is determined, the form of the board around the solder bump can be expressed by a curvature radius R and a displacement z (FIG. 16). Since Formula (7) shows that the damage value is represented by the function of the strain amplitude, the vibration damage value of the target junction can be estimated by the vibration damage value of the dummy junction if the relationship between the strain amplitude of the dummy junction and that of the target junction is obtained. Accordingly, as shown in FIG. 17, the relationship between a curvature radius variation $\Delta R$ or a displacement variation $\Delta z$ and the strain amplitude $\Delta\epsilon$ of each solder bump (dummy bump, target bump) is previously obtained by the finite element method. In this way, as shown in FIG. 18, the damage value of the target junction induced by vibration can be estimated. In FIG. 18, the formula of $D_{v2}=D_{v1}\cdot \Delta k^{-\beta}$ corresponds to the load correspondence data.

Note that it is also possible to create a lookup table by relating the damage values $D_{v1}$ and $D_{v2}$ based on the formula of $D_{v2}=D_{v1}\cdot \Delta k^{-\beta}$ to use this table as the load correspondence data. When the damage value $D_{v2}$ is not existent in the table, the damage value $D_{v1}$ can be estimated by performing an interpolation process such as a linear interpolation using the previous and next data of this value.

Figure 15:
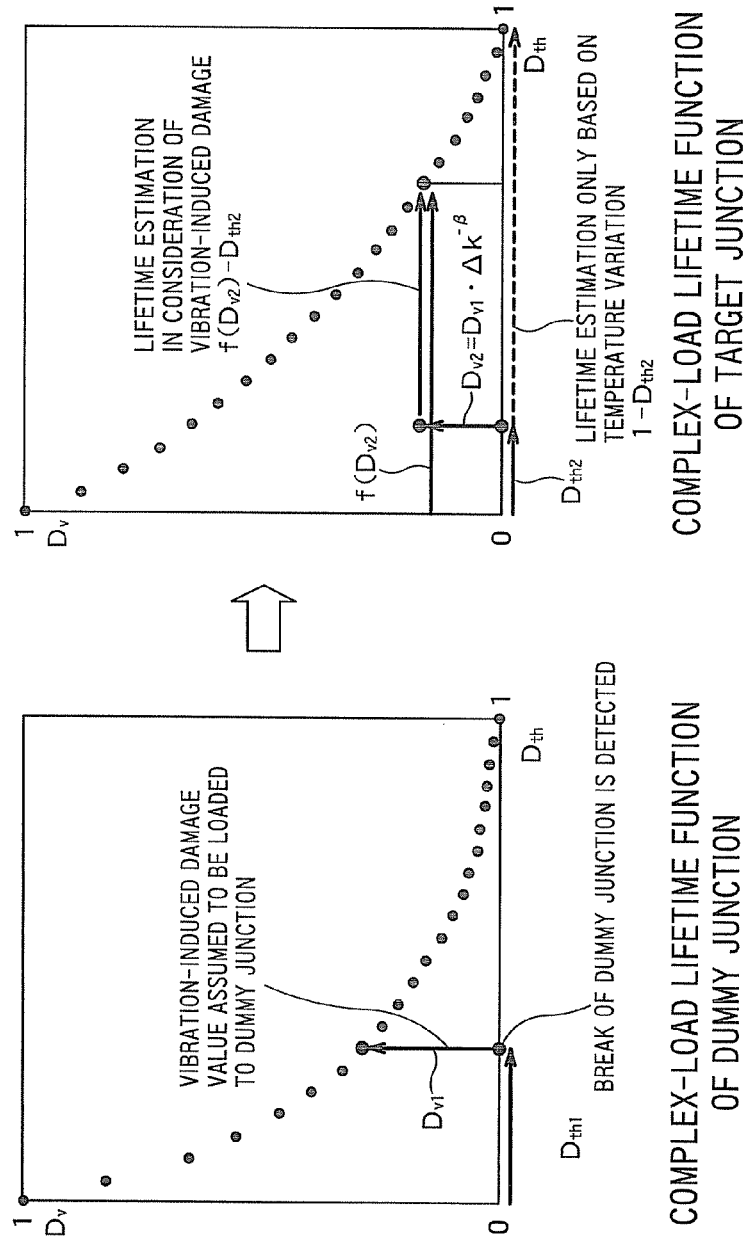
FIG. 15 is a diagram showing how the lifetime of the target junction is shortened when taking the influence of vibration into consideration.

Based on the load correspondence data thus created, the lifetime calibration will be concretely explained using FIG. 15. In FIG. 15, the dummy lifetime data (complex-load lifetime function) of the dummy junction 112 is shown on the left side and the complex-load lifetime function of the target junction 111 is shown on the right side. The vibration damage value $D_{v2}$ of the target junction 111 is estimated by the vibration damage value $D_{v1}$ of the dummy junction 112 based on the load correspondence data. As shown on the right side of FIG. 15, the residual lifetime of the target junction 111 influenced by the temperature variation when the influence of vibration is taken into consideration is expressed as $f(D_{v2})-D_{th2}$. The residual lifetime when the influence of vibration is not taken into consideration is $1-D_{th2}$, which shows that the lifetime is shortened by $1-f(D_{v2})$. The changed threshold value (first threshold value) is shown by $f(D_{v2})$. In the target lifetime data (see Formula (9)), $f(D_{v2})$ shows the temperature damage value corresponding to the vibration damage value $D_{v2}$. As stated above, the first threshold value is changed to a value obtained by taking the influence of vibration applied to the target junction 111 into consideration, by which the lifetime of the target junction 111 is calibrated.

Note that when there are a plurality of dummy bumps serving as dummy junctions as shown in FIG. 4, the above process determined by the relationship between the target junction and the dummy junction is repeated every time one of the dummy bumps is broken, by which the lifetime of the target junction can be predicted with further high accuracy.

As stated above, according to the embodiment of the present invention, the lifetime estimation of a solder junction in an electronic component can be achieved with high accuracy by calibrating (correcting) the lifetime based on a load other than a load to be monitored.

Second Embodiment

Figure 19:
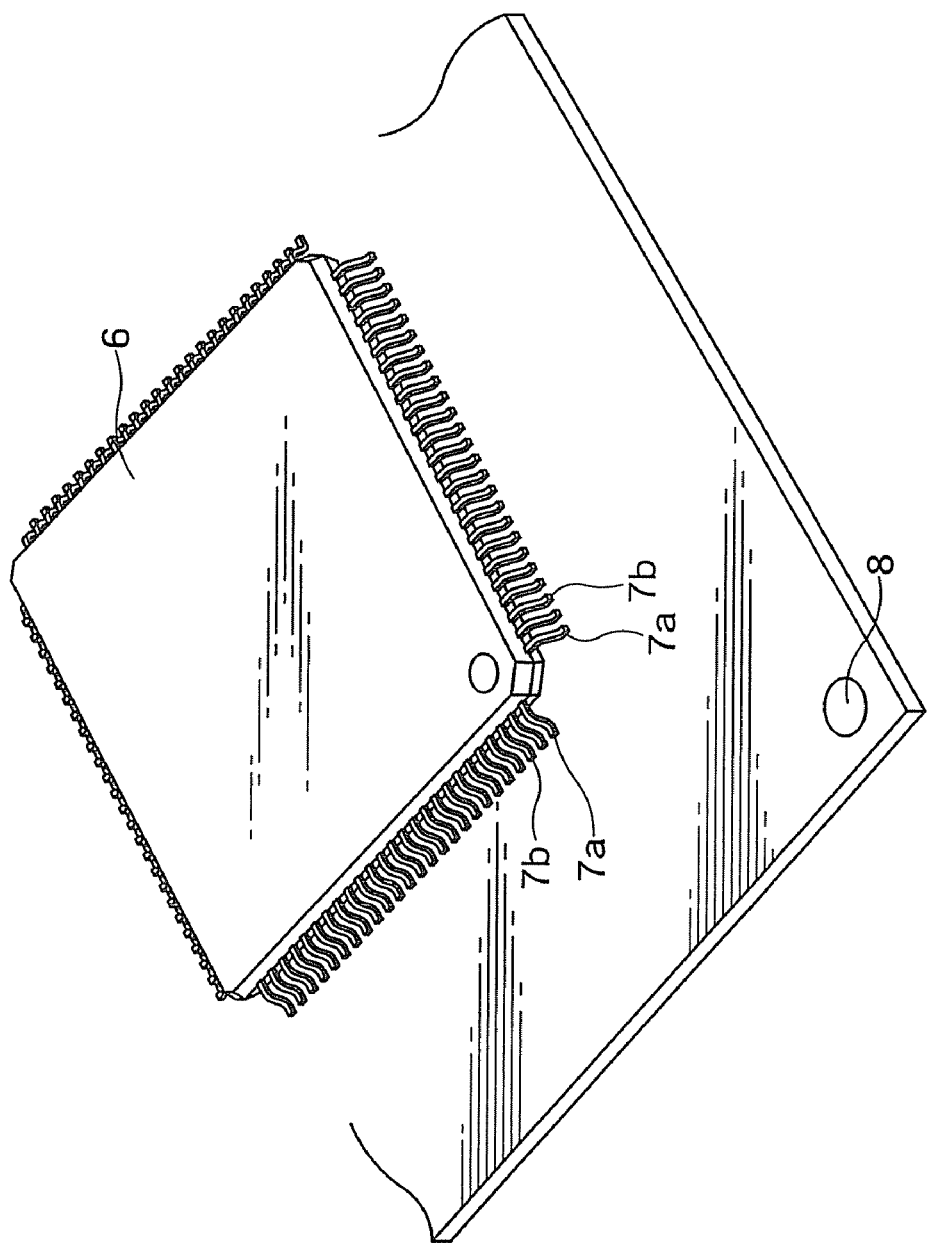
FIG. 19 is a diagram showing an example of a dummy junction and a target junction according to a second embodiment.

In the present embodiment, as shown in FIG. 19, a component (package) 6 such as a QFP (Quad Flat Package) having leads is mounted on the surface of the board. As in the first embodiment, a temperature sensor is arranged in or around the package 6. Also in the QFP, the leads near the four corners are generally used as dummy junctions since the greatest stress is generated in these leads. Accordingly, leads 7a are used as the dummy junctions 112. It is more preferable that the leads near a boss hole 8, through which the board and the housing are connected, are used as the dummy junctions 112 when based on a standard transmission route of force, a transformation form is taken into consideration. Further, one or more leads other than the leads at the four corners, which are leads 7b, for example, are used as the target junctions 111. Both of a target component 11 and a dummy component 12 is the same component 6. Fundamentally, the lifetime estimation can be performed in a similar method to that of the first embodiment by replacing the bump form with the form around the lead in the method for determining the strain amplitude in FIG. 10.

Third Embodiment

Figure 20:
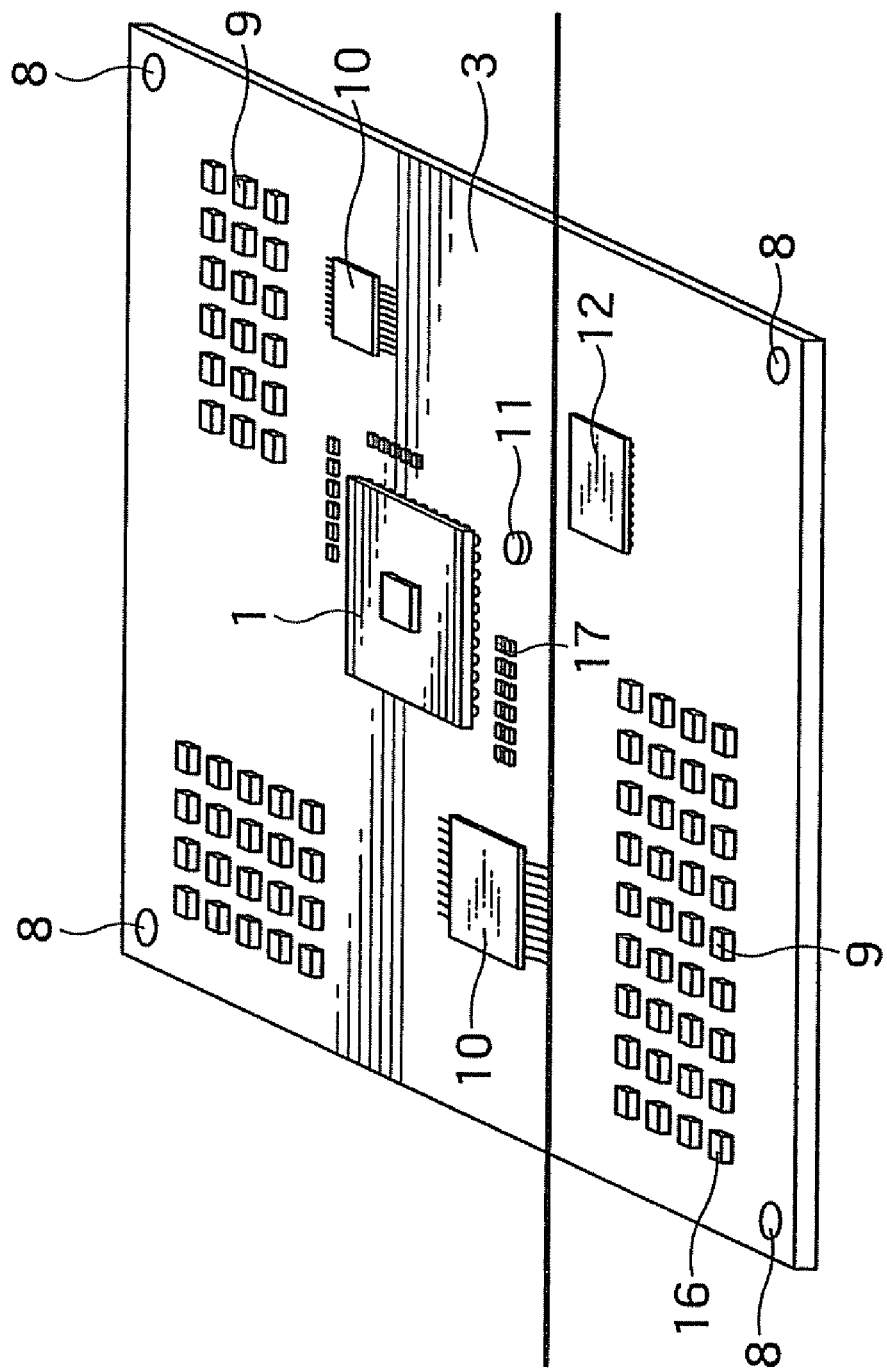
FIG. 20 is a diagram for explaining a method for determining a dummy junction according to a third embodiment.
Figure 21:
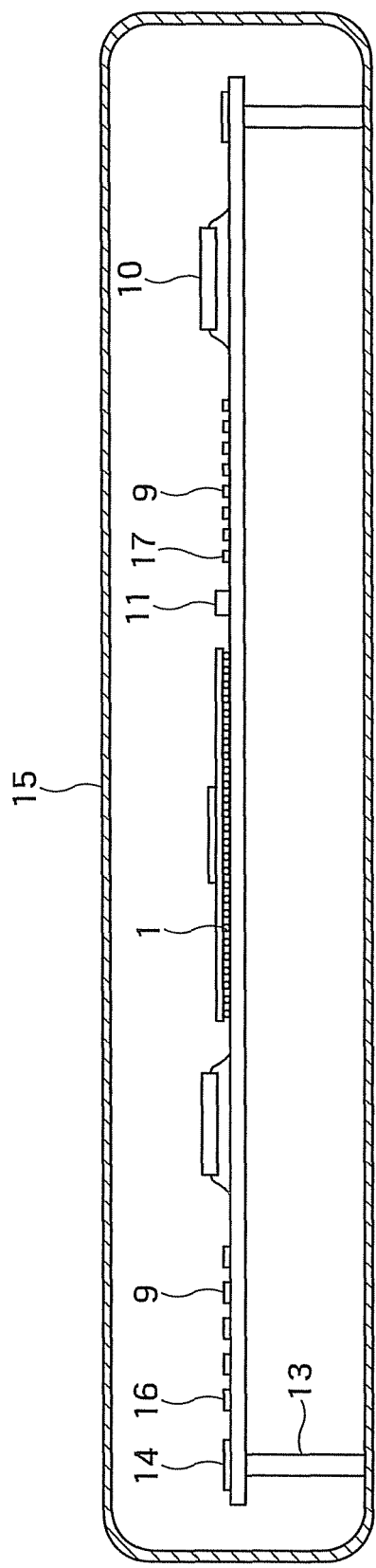
FIG. 21 is a diagram for explaining the method for determining the dummy junction according to the third embodiment.

As shown in FIGS. 20 and 21, an electronic device has many components (electronic components) mounted on the board. The electronic device includes: the BGA (Ball Grid Array) package 1; the board 3; the boss holes 8, chip-mounted components 9, a TSOP (Thin Small Outline Package) 10; a temperature sensor 11; a CSP (Chip Size Package) 12; bosses 13; screws 14; a housing 15; and chip-component-type detection devices 16 and 17.

In many components mounted on the board, multiple chip component 9 such as a chip capacitor and a chip resistance is particularly large. Accordingly, it is a problem to determine where the dummy junction should be positioned.

In such a case, it is desirable to determine the dummy junctions by selecting the junctions each of which undergoes the largest influence of a heat load or an external force (load). For example, in order to calibrate (correct) the influence of the external force (load), it is effective to select the device 16, which is the nearest to the connection unit 8 of the board, as the dummy junction (the dummy junction is between the device 16 and the board 3.) On the other hand, when the influence of the temperature variation is focused in the monitoring, it is desirable to select the device 17, which is near the BGA 1 being a heating component, as the dummy junction (the dummy junction is between the device 17 and the board 3.) It is more desirable to determine such a best condition by previously obtaining the state of transformation or stress based on an experiment or a numerical simulation while taking the load to be focused into consideration.

Even when the dummy junction and the target junction are components different from each other, or when the dummy junction and the target junction are the same kind of components having different forms, a technique basically similar to that of the first embodiment can be used to perform calibration (correction) when the dummy junction is broken. Concretely, the lifetime can be calibrated (estimated) when the dummy junction is broken by performing the steps of: creating the complex load database in FIGS. 7 to 9; creating the sensor temperature/junction strain database in FIGS. 11 to 12; and constructing the relationship of the strain amount of the target junction and that of the dummy junction FIGS. 16 to 18.

What is claimed is:

1. A monitoring device for an electronic device which includes a board and at least one electronic component mounted thereon, the board and the electronic component being coupled with each other through a target junction and a dummy junction at different positions, comprising:
    a temperature sensor configured to detect a temperature in the electronic device;
    a temperature information database configured to store variation history of the temperature;
    a sensor temperature/strain database configured to store a strain value generated in the target junction and a strain value generated in the dummy junction with respect to each of a plurality temperatures;
    a fatigue characteristic database configured to store
    a dummy damage function representing a relation among a strain amplitude representing magnitude of variation of the strain value, a cycle number of the strain amplitude and a temperature damage value of the dummy junction indicating an accumulated fatigue on the dummy junction due to temperature variation, and
    a target damage function representing a relation among a strain amplitude, a cycle number of the strain amplitude and a temperature damage value of the target junction indicating an accumulated fatigue on the target junction due to temperature variation;
    a complex load database configured to store:
    (a) dummy lifetime data which defines a relation between the temperature damage value of the dummy junction and a load damage value indicating an accumulated fatigue on the dummy junction due to a first load which is different from the temperature variation;
    (b) target lifetime data which defines a relation between the temperature damage value of the target junction and a load damage value indicating an accumulated fatigue on the target junction due to the first load; and
    (c) load correspondence data which defines a relation between the load damage value of the dummy junction and the load damage value of the target junction;
    an electrical characteristic measurer configured to measure an electrical characteristic of the dummy junction; and
    a lifetime computing unit configured to:
    (A-1) calculate the temperature damage value of the target junction by using the target damage function based on the variation history;
    (A-2) estimate a lifetime of the target junction based on comparison between the temperature damage value of the target junction and a first threshold value being a temperature damage value corresponding to 0 of the load damage value of the target junction in the target lifetime data;
    (B-1) calculate the temperature damage value of the dummy junction by using the dummy damage function based on the temperature history data when a break of the dummy junction is detected based on the electrical characteristic measured by the electrical characteristic measurer;
    (B-2) compare the temperature damage value of the dummy junction with a second threshold value being a temperature damage value corresponding to 0 of the load damage value of the dummy junction in the dummy lifetime data;

(B-3) calculate the load damage value of the dummy junction based on the dummy lifetime data according to the temperature damage value of the dummy junction when a difference between the second threshold value and the temperature damage value of the dummy junction is equal to or greater than a predetermined value;

(B-4) calculate the load damage value of the target junction based on the load damage value of the dummy junction by using the load correspondence function; and (B-5) change the first threshold value to a temperature damage value corresponding to the load damage value of the target junction in the target lifetime data.

2. The device according to claim 1, wherein the lifetime computing unit determines not to change the first threshold value when a difference between the second threshold value and the temperature damage value of the dummy junction is smaller than the predetermined value.

3. The device according to claim 1, wherein each of the dummy junction and the target junction is a solder junction or a lead wire.

4. The device according to claim 1, wherein the first load is a vibration or a shock induced by an external force.

5. The device according to claim 1, wherein the lifetime computing unit determines that, a lifetime of the target junctions is nearly or actually exhausted when a difference between the temperature damage value of the target junction and the first threshold value is equal to or smaller than a predetermined value.

6. The device according to claim 5, wherein the lifetime computing unit takes a predetermined action when the difference is equal to or smaller than the predetermined value.

7. The device according to claim 1, wherein the dummy lifetime data is a function having one of the temperature damage value and the load damage value of the dummy junction as an input and the other as an output.

8. The device according to claim 1, wherein the dummy lifetime data is a look-up table including the temperature damage value and the load damage value of the dummy junction.

9. The device according to claim 1, wherein the target lifetime data is a function having one of the temperature damage value and the load damage value of the target junction as an input and the other as an output.

10. The device according to claim 1, wherein the target lifetime data is a look-up table including the temperature damage value and the load damage value of the target junction.

11. The device according to claim 1, wherein the dummy junction is provided at a corner of the electronic component and the target junction is provided at a position different from the corner of the electronic component.

12. A monitoring method for an electronic device which includes a board and at least one electronic component mounted thereon, the board and the electronic component being coupled with each other through a target junction and a dummy junction at different positions, comprising:

a processor-implemented act of executing computer executable instructions stored on a computer readable medium to implement the following:

reading in a temperature information database configured to store variation history of the temperature;

reading in a sensor temperature/strain database configured to store a strain value generated in the target junction and a strain value generated in the dummy junction with respect to each of a plurality temperatures;

reading in a fatigue characteristic database configured to store a dummy damage function representing a relation among a strain amplitude representing magnitude of variation of the strain value, a cycle number of the strain amplitude and a temperature damage value of the dummy junction indicating an accumulated fatigue on the dummy junction due to temperature variation, and a target damage function representing a relation among a strain amplitude, a cycle number of the strain amplitude and a temperature damage value of the target junction indicating an accumulated fatigue on the target junction due to temperature variation;

reading in a complex load database configured to store:

(a) dummy lifetime data which defines a relation between the temperature damage value of the dummy junction and a load damage value indicating an accumulated fatigue on the dummy junction due to a first load which is different from the temperature variation;

(b) target lifetime data which defines a relation between the temperature damage value of the target junction and a load damage value indicating an accumulated fatigue on the target junction due to the first load; and (c) load correspondence data which defines a relation between the load damage value of the dummy junction and the load damage value of the target junction; measuring an electrical characteristic of the dummy junction; and (A-1) calculating the temperature damage value of the target junction by using the target damage function based on the variation history;

(A-2) estimating a lifetime of the target junction based on comparison between the temperature damage value of the target junction and a first threshold value which is a temperature damage value corresponding to 0 of the load damage value of the target junction in the target lifetime data;

(B-1) calculating the temperature damage value of the dummy junction by using the dummy damage function based on the variation history when a break of the dummy junction is detected based on the electrical characteristic of the dummy junction;

(B-2) comparing the temperature damage value of the dummy junction with a second threshold value being a temperature damage value corresponding to 0 of the load damage value of the dummy junction in the dummy lifetime data;

(B-3) calculating the load damage value of the dummy junction based on the dummy lifetime data according to the temperature damage value of the dummy junction when a difference between the second threshold value and the temperature damage value of the dummy junction is equal to or greater than a predetermined value;

(B-4) calculating the load damage value of the target junction based on the load damage value of the dummy junction by using the load correspondence function; and (B-5) changing the first threshold value to a temperature damage value corresponding to the load damage value of the target junction in the target lifetime data.

* * * * *